(12) United States Patent
Park et al.

(10) Patent No.: US 12,414,438 B2
(45) Date of Patent: Sep. 9, 2025

(54) DISPLAY DEVICE

(71) Applicant: LG Display Co., Ltd., Seoul (KR)

(72) Inventors: SungJin Park, Paju-si (KR); SangBin Lee, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 459 days.

(21) Appl. No.: 18/077,845

(22) Filed: Dec. 8, 2022

(65) Prior Publication Data

US 2023/0217705 A1 Jul. 6, 2023

(30) Foreign Application Priority Data

Dec. 31, 2021 (KR) .................. 10-2021-0194511

(51) Int. Cl.
*H10K 59/40* (2023.01)
*H10K 59/121* (2023.01)
*H10K 59/131* (2023.01)
*H10K 59/65* (2023.01)

(52) U.S. Cl.
CPC ......... *H10K 59/121* (2023.02); *H10K 59/131* (2023.02); *H10K 59/40* (2023.02); *H10K 59/65* (2023.02)

(58) Field of Classification Search
None
See application file for complete search history.

(56) References Cited

U.S. PATENT DOCUMENTS

2023/0064771 A1* 3/2023 Cho .................. G09G 3/3233

* cited by examiner

*Primary Examiner* — Kyoung Lee
(74) *Attorney, Agent, or Firm* — Birch, Stewart, Kolasch & Birch, LLP

(57) ABSTRACT

A display device can include a display area comprising a first optical area and a normal area located outside of the first optical area, the first optical area including a central area and a bezel area located outside of the central area; a plurality of wiring lines located in the first optical area a first light emitting element located in the first optical area; and a second light emitting element located in the first optical area. Also, a first anode electrode line of the first light emitting element jumps over a second anode electrode line of the second light emitting element in an area in which the plurality of wiring lines are located.

24 Claims, 15 Drawing Sheets

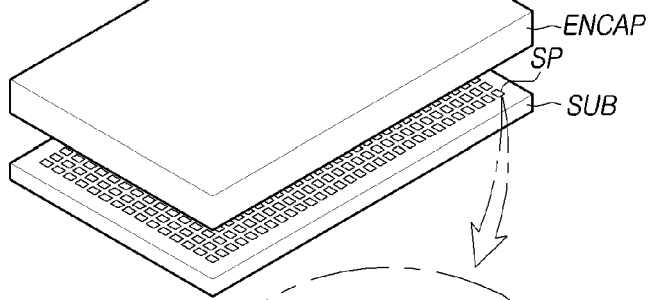
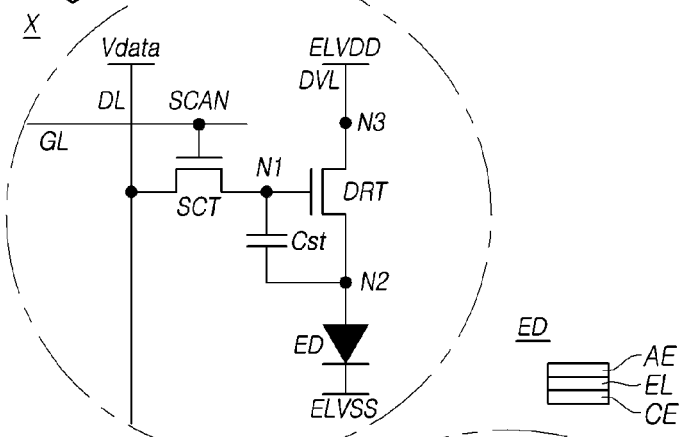
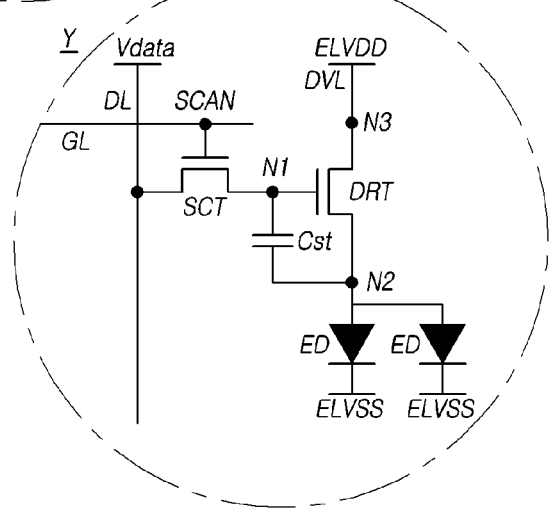
FIG.3

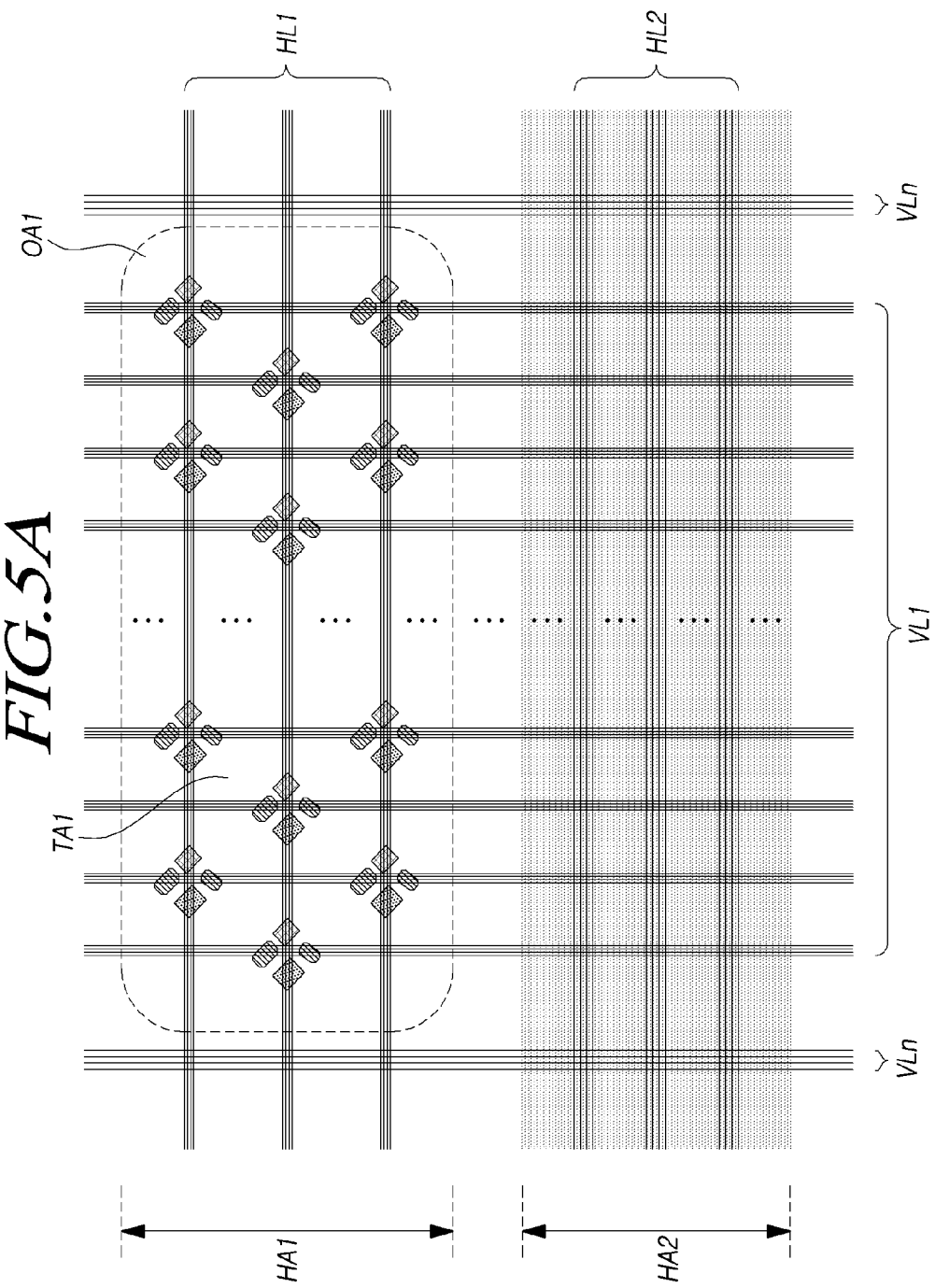

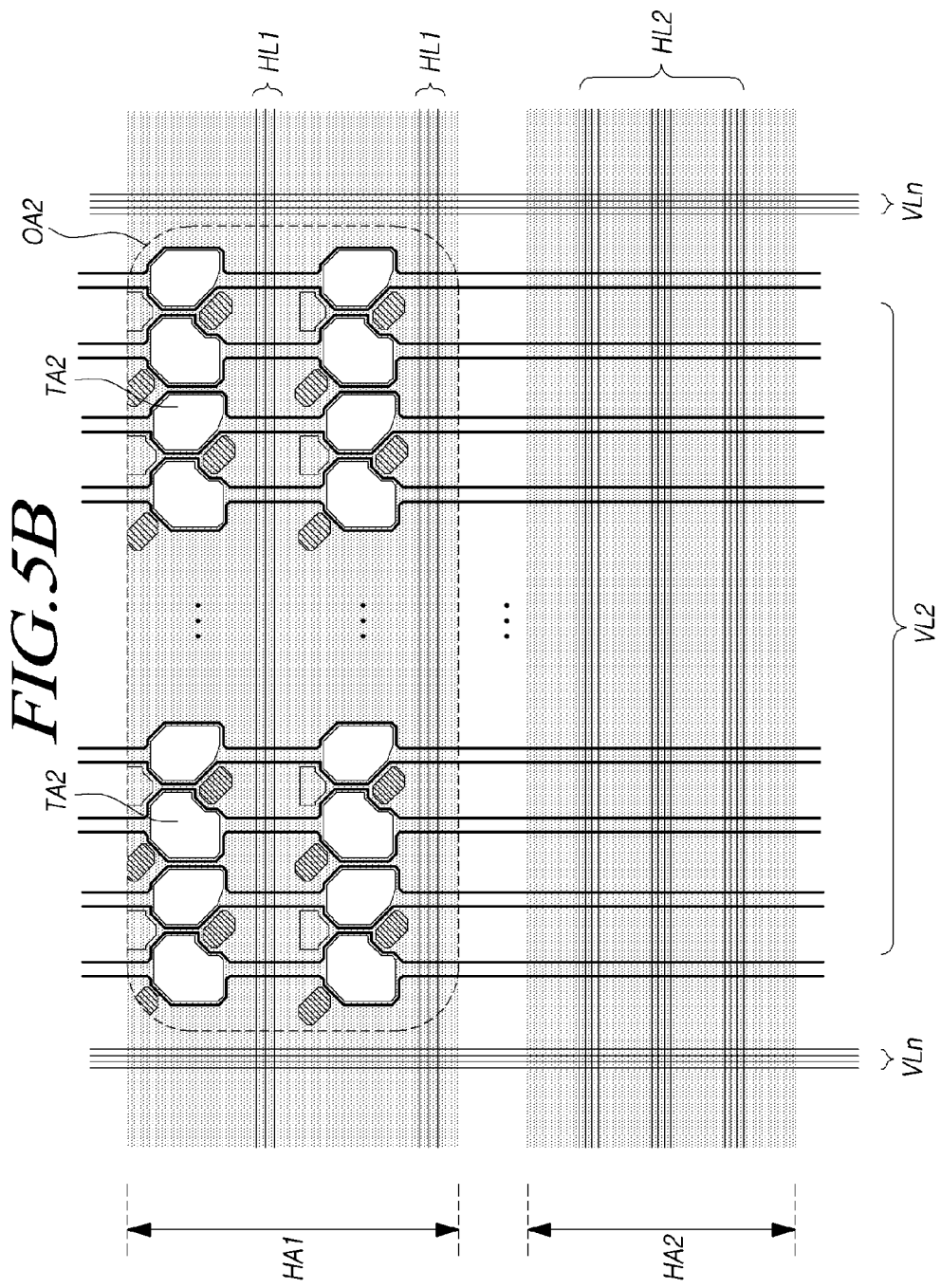

DISPLAY DEVICE

CROSS-REFERENCE TO RELATED APPLICATION

This application claims priority to Korean Patent Application No. 10-2021-0194511, filed on Dec. 31, 2021, in the Republic of Korea, which is incorporated by reference in its entirety into the present application.

BACKGROUND

Technical Field

The present disclosure relates to electronic devices, and more specifically, to display devices.

Description of the Related Art

As display technology advances, display devices can provide an increasing multitude of functions, such as an image capture function, a sensing function, and the like, as well as an image display function. To provide these functions, a display device may need to include an optical electronic device, such as a camera, a sensor for detecting an image, and the like.

In order to receive light passing through a front surface of a display device, it can be desirable for an optical electronic device to be located in an area of the display device where incident light coming from or through the front surface can be advantageously received or detected. Thus, in such a display device, the optical electronic device can be located in a front portion of the display device to allow the optical electronic device to be effectively exposed to incident light. In order to install the optical electronic device in such an implementation, an increased bezel of the display device can be designed, or a notch or a hole can be formed in a display area of a display panel of the display device.

Therefore, as a display device needs an optical electronic device to receive or detect incident light, and perform an intended function, the size of the bezel in the front portion of the display device can be increased, or a substantial disadvantage may be encountered in designing the front portion of the display device. For example, many users may find that looking at a large bezel or a large notched portion in the display screen is rather noticeable and undesirable, and impairs or distracts from viewing the displayed images.

SUMMARY OF THE DISCLOSURE

The inventors have developed techniques for providing or placing one or more optical electronic devices in a display device without reducing an area of a display area of a display panel of the display device. Through the development, the inventors have invented a display device including a light transmission structure in which even when an optical electronic device is located under a display area of a display panel, and thus, is not exposed in the front surface of the display device, the optical electronic device can still normally and properly receive or detect light even though the optical electronic device is disposed under the display panel.

One or more embodiments of the present disclosure can provide a display device including a first optical area with a high transmittance by having a structure in which a plurality of horizontal lines and first and second light emitting elements are located in the first optical area, and a first anode electrode line of the first light emitting element jumps a second anode electrode line of the second light emitting element in an area in which the plurality of horizontal lines are located. The plurality of horizontal lines can be substantially horizontal or can be disposed vertically or diagonal according to design variations or a change of reference point.

According to aspects of the present disclosure, a display device is provided that includes a display area, a plurality of horizontal lines, and first and second light emitting elements.

The display area can include a first optical area and a normal area located outside of the first optical area.

The first optical area can include a central area and a bezel area located outside of the central area.

The plurality of horizontal lines, the first light emitting element, and the second light emitting element can be located in the first optical area.

A first anode electrode line of the first light emitting element can jump over a second anode electrode line of the second light emitting element in an area in which the plurality of horizontal lines are located.

According to one or more embodiments of the present disclosure, a display device can be provided that includes a first optical area with a high transmittance by having a structure in which a first anode electrode line of a first light emitting element jumps over a second anode electrode line of a second light emitting element in an area in which a plurality of horizontal lines are located.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure. In the drawings:

FIG. 3 illustrates an example equivalent circuit of a subpixel in the display device according to aspects of the present disclosure;

FIG. 5A illustrates example arrangements of signal lines in each of a first optical area and a normal area in the display device according to aspects of the present disclosure;

FIG. 5B illustrates example arrangements of signal lines in each of a second optical area and a normal area in the display device according to aspects of the present disclosure;

DETAILED DESCRIPTION OF THE EMBODIMENTS

Figure 1A:
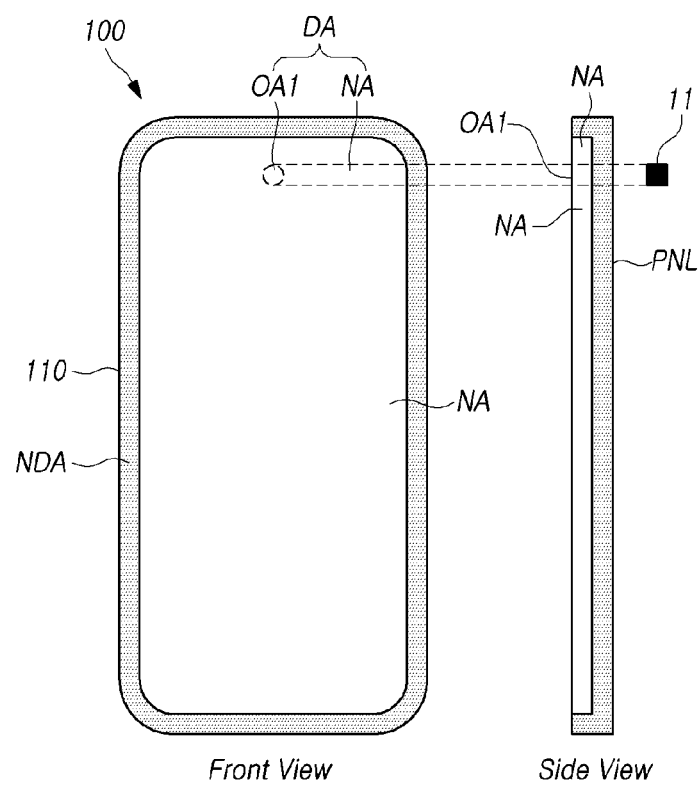
FIGS. 1A, 1B and 1C are plan views illustrating an example display device according to aspects of the present disclosure.

Reference will now be made in detail to embodiments of the present disclosure, examples of which can be illustrated in the accompanying drawings.

In the following description, the structures, embodiments, implementations, methods and operations described herein are not limited to the specific example or examples set forth herein and can be changed as is known in the art, unless otherwise specified. Like reference numerals designate like elements throughout, unless otherwise specified. Names of the respective elements used in the following explanations are selected only for convenience of writing the specification and can thus be different from those used in actual products.

Advantages and features of the present disclosure, and implementation methods thereof will be clarified through following example embodiments described with reference to the accompanying drawings. The present disclosure can, however, be embodied in different forms and should not be construed as limited to the example embodiments set forth herein. Rather, these example embodiments are provided so that this disclosure can be sufficiently thorough and complete to assist those skilled in the art to fully understand the scope of the present disclosure.

Further, the protected scope of the present disclosure is defined by claims and their equivalents. In the following description, where the detailed description of the relevant known function or configuration can unnecessarily obscure aspects of the present disclosure, a detailed description of such known function or configuration can be omitted.

The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements can be added unless the term, such as "only," is used. An element described in the singular form is intended to include a plurality of elements, and vice versa, unless the context clearly indicates otherwise.

Although the terms "first," "second," A, B, (a), (b), and the like can be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

For the expression that an element or layer is "connected," "coupled," or "adhered" to another element or layer, the element or layer can not only be directly connected, coupled, or adhered to another element or layer, but also be indirectly connected, coupled, or adhered to another element or layer with one or more intervening elements or layers "disposed" or "interposed" between the elements or layers, unless otherwise specified. For the expression that an element or layer "contacts," "overlaps," or the like with another element or layer, the element or layer can not only directly contact, overlap, or the like with another element or layer, but also indirectly contact, overlap, or the like with another element or layer with one or more intervening elements or layers "disposed" or "interposed" between the elements or layers, unless otherwise specified.

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom," "downward," "upward," "upper," "lower," and the like refer to an arbitrary frame of reference.

Where positional relationships are described, for example, where the positional relationship between two parts is described using "on," "over," "under," "above," "below," "beside," "next," or the like, one or more other parts can be located between the two parts unless a more limiting term, such as "immediate(ly)," "direct(ly)," or "close(ly)" is used. For example, where an element or layer is disposed "on" another element or layer, a third element or layer can be interposed therebetween. Furthermore, the terms "left," "right," "top," "bottom," "downward," "upward," "upper," "lower," and the like refer to an arbitrary frame of reference. In describing a temporal relationship, when the temporal order is described as, for example, "after," "subsequent," "next," or "before," a situation which is not continuous can be included unless a more limiting term, such as "just," "immediate(ly)," or "direct(ly)," is used. Further, the term "may" fully encompasses all the meanings of the term "can."

The term "at least one" should be understood as including any or all combinations of one or more of the associated listed items. For example, the meaning of "at least one of a first element, a second element, and a third element" encompasses the combination of all three listed elements, combinations of any two of the three elements, as well as each individual element, the first element, the second element, and the third element.

The expression of a first element, a second elements "and/or" a third element should be understood as one of the first, second and third elements or as any or all combinations of the first, second and third elements. By way of example, A, B and/or C can refer to only A, only B, or only C; any or some combination of A, B, and C; or all of A, B, and C.

Hereinafter, with reference to the accompanying drawings, various embodiments of the present disclosure will be described in detail. All components of each display device according to all embodiments of the present disclosure are operatively coupled and configured.

Figure 1B:
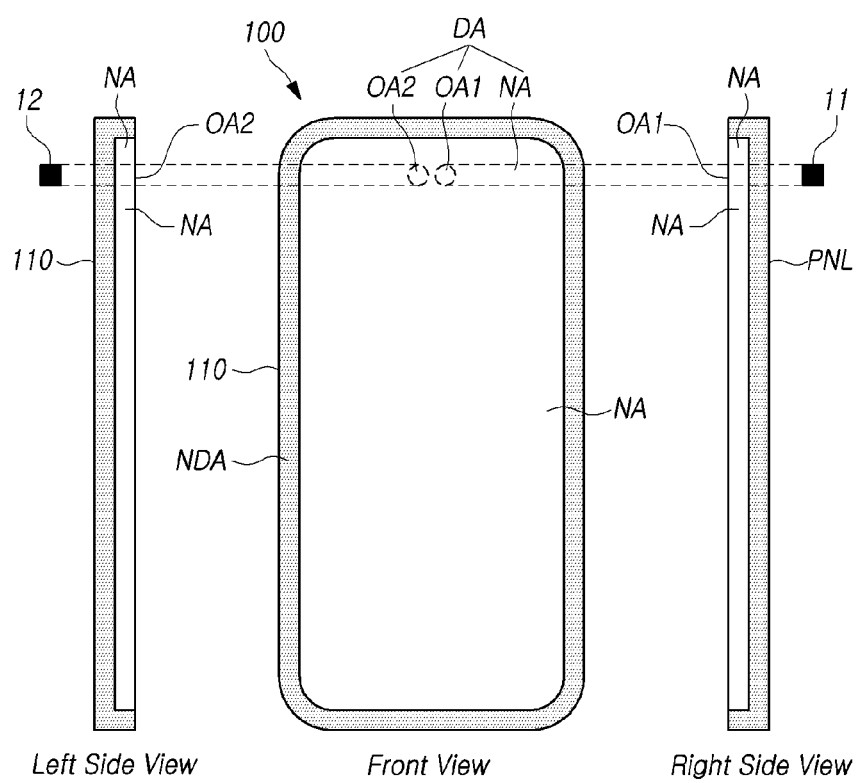
Figure 1C:
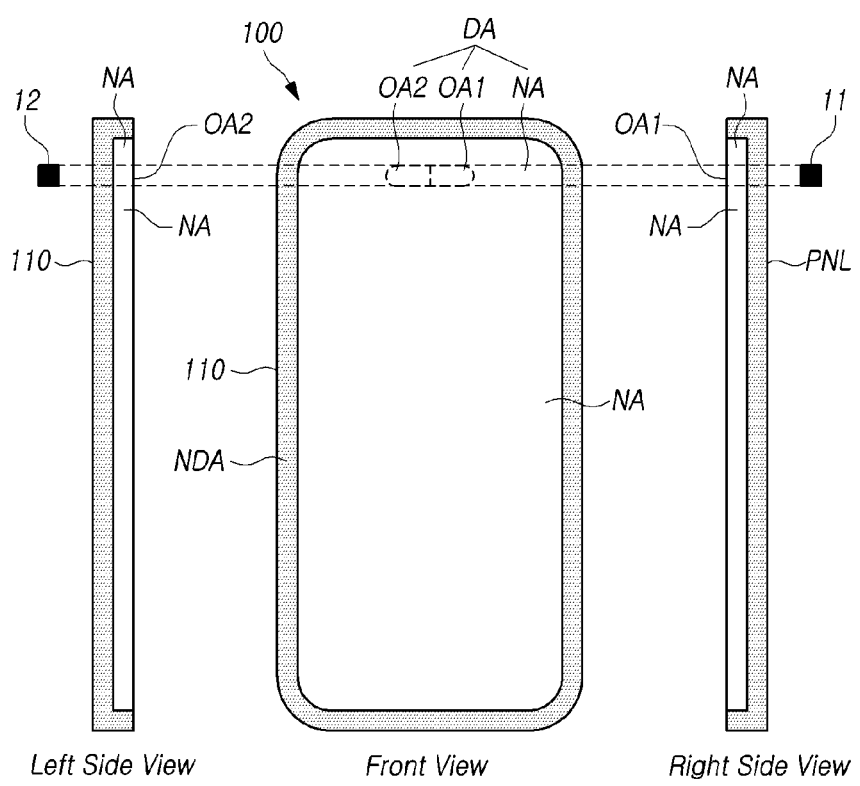

FIGS. 1A, 1B and 1C are plan views illustrating an example display device according to aspects of the present disclosure.

Referring to FIGS. 1A, 1B, and 1C, a display device 100 according to aspects of the present disclosure can include a display panel PNL for displaying an image, and one or more optical electronic devices (11 and/or 12). Herein, an optical electronic device can be referred to as a light detector, a light receiver, or a light sensing device. An optical electronic device can include one or more of a camera, a camera lens, a sensor, a sensor for detecting images, or the like.

The display panel PNL can include a display area DA in which an image is displayed and a non-display area NDA in which an image is not displayed.

A plurality of subpixels can be arranged in the display area DA, and several types of signal lines for driving the plurality of subpixels can be arranged therein.

The non-display area NDA can refer to an area outside of the display area DA. Several types of signal lines can be arranged in the non-display area NDA, and several types of driving circuits can be connected thereto. At least a portion of the non-display area NDA can be bent to be invisible or hidden from the front of the display panel or can be covered by a case of the display panel PNL or the display device 100. The non-display area NDA can be also referred to as a bezel or a bezel area.

Referring to FIGS. 1A, 1B, and 1C, in the display device 100 according to aspects of the present disclosure, the one or more optical electronic devices (11 and/or 12) can be located under, embedded within, or in a lower portion of, the display panel PNL (e.g., at an opposite side to the viewing surface thereof).

Light can enter the front surface (viewing surface) of the display panel PNL, pass through the display panel PNL, reach one or more optical electronic devices (11 and/or 12) located under, embedded within, or in the lower portion of, the display panel PNL (the opposite side or rear side of the viewing surface).

The one or more optical electronic devices (11 and/or 12) can receive or detect light transmitting through the display panel PNL and perform a predefined function based on the received light. For example, the one or more optical electronic devices (11 and/or 12) can include one or more of the following: an image capture device such as a camera (an image sensor), and/or the like; or a sensor such as a proximity sensor, an illuminance sensor, and/or the like.

Referring to FIGS. 1A, 1B, and 1C, in the display panel PNL according to aspects of the present disclosure, the display area DA can include one or more optical areas (OA1 and/or OA2) and a normal area NA. Herein, the term "normal area" NA is an area that while being present in the display area DA, does not overlap with one or more optical electronic devices (11 and/or 12) and can also be referred to as a non-optical area.

Referring to FIGS. 1A, 1B, and 1C, the one or more optical areas (OA1 and/or OA2) can be one or more areas overlapping the one or more optical electronic devices (11 and/or 12).

According to an example of FIG. 1A, the display area DA can include a first optical area OA1 and a normal area NA. In this example, at least a portion of the first optical area OA1 can overlap with a first optical electronic device 11.

According to an example of FIG. 1B, the display area DA can include a first optical area OA1, a second optical area OA2, and a normal area NA. In the example of FIG. 1B, at least a portion of the normal area NA can be present between the first optical area OA1 and the second optical area OA2. In this example, at least a portion of the first optical area OA1 can overlap with the first optical electronic device 11, and at least a portion of the second optical area OA2 can overlap with a second optical electronic device 12.

According to an example of FIG. 1C, the display area DA can include a first optical area OA1, a second optical area OA2, and a normal area NA. In the example of FIG. 1C, the normal area NA may not be present between the first optical area OA1 and the second optical area OA2. For example, the first optical area OA1 and the second optical area OA2 can contact each other or be in direct communication with each other (e.g., directly contact each other, such as forming an oval shaped area or racetrack shaped area). In this example, at least a portion of the first optical area OA1 can overlap the first optical electronic device 11, and at least a portion of the second optical area OA2 can overlap the second optical electronic device 12.

In some embodiments, an image display structure and a light transmission structure are desirable to be formed in the one or more optical areas (OA1 and/or OA2). For example, since the one or more optical areas (OA1 and/or OA2) are a portion of the display area DA, therefore, subpixels for displaying an image are needed to be disposed in the one or more optical areas (OA1 and/or OA2). Further, to enable light to be able to be transmitted to the one or more optical electronic devices (11 and/or 12), a light transmission structure is needed, and thus is formed in the one or more optical areas (OA1 and/or OA2).

Even though the one or more optical electronic devices (11 and/or 12) are needed to receive or detect light, the one or more optical electronic devices (11 and/or 12) can be located on the back of the display panel PNL or under the display panel PNL (e.g., on an opposite side of a viewing surface). In this embodiment, the one or more optical electronic devices (11 and/or 12) are located, for example, under, or in a lower portion of, the display panel PNL, and is configured to receive light that has transmitted the display panel PNL. Alternatively, the one or more optical electronic devices (11 and/or 12) can be embedded within the display panel PNL (e.g., within a middle layer or an intermediate layer).

For example, the one or more optical electronic devices (11 and/or 12) are not exposed in the front surface (viewing surface) of the display panel PNL. Accordingly, when a user faces the front surface of the display device 100, the one or more optical electronic devices (11 and/or 12) are located so that they are invisible to the user or hidden from view.

In one embodiment, the first optical electronic device 11 can be a camera, and the second optical electronic device 12 can be a sensor such as a proximity sensor, an illuminance sensor, an infrared sensor, and/or the like. For example, the camera can be a camera lens, an image sensor, or a unit including at least one of the camera lens and the image sensor. The sensor can be, for example, an infrared sensor capable of detecting infrared rays.

In another embodiment, the first optical electronic device 11 can be a sensor, and the second optical electronic device 12 can be a camera.

Hereinafter, simply for convenience, discussions that follow will refer to embodiments where the first optical electronic device 11 is a camera, and the second optical electronic device 12 is a sensor. It should be, however, understood that the scope of the present disclosure includes embodiments where the first optical electronic device 11 is the sensor, and the second optical electronic device 12 is the camera. For example, the camera can be a camera lens, an image sensor, or a unit including at least one of the camera lens and the image sensor.

In the example where the first optical electronic device 11 is a camera, this camera can be located on the back of (e.g., under, or in a lower portion of) the display panel PNL, and be a front camera capable of capturing objects or images in a front direction of the display panel PNL. Accordingly, the user can capture an image or object through the camera that is hidden from view or invisible on the viewing surface while looking at the viewing surface of the display panel PNL.

Although the normal area NA and the one or more optical areas (OA1 and/or OA2) included in the display area DA in each of FIGS. 1A, 1B, and 1C are areas where images can be displayed, the normal area NA is an area where a light transmission structure need not be formed, but the one or more optical areas (OA1 and/or OA2) are areas where the light transmission structure needs to be formed. Thus, in some embodiments, the normal area NA is an area where a light transmission structure is not implemented or included, and the one or more optical areas (OA1 and/or OA2) are areas in which the light transmission structure is implemented or included.

Accordingly, the one or more optical areas (OA1 and/or OA2) can have a transmittance that is greater than or equal to a predetermined level, e.g., a relatively high transmittance, and the normal area NA may not have light transmittance or have a transmittance that is less than the predetermined level e.g., a relatively low transmittance.

For example, the one or more optical areas (OA1 and/or OA2) can have a resolution, a subpixel arrangement structure, the number of subpixels per unit area, an electrode structure, a line structure, an electrode arrangement structure, a line arrangement structure, or/and the like different from that/those of the normal area NA, such as a lower pixel density or lower wiring density.

In one embodiment, the number of subpixels per unit area in the one or more optical areas (OA1 and/or OA2) can be less than the number of subpixels per unit area in the normal area NA. For example, the resolution of the one or more optical areas (OA1 and/or OA2) can be lower than that of the normal area NA. Here, the number of subpixels per unit area can be a unit for measuring resolution, for example, referred to as pixels (or subpixels) per inch (PPI), which represents the number of pixels (or subpixels) within 1 inch.

In one embodiment, in each of FIGS. 1A, 1B, and 1C, the number of subpixels per unit area in the first optical areas OA1 can be less than the number of subpixels per unit area in the normal area NA. In one embodiment, in each of FIGS. 1B and 1C, the number of subpixels per unit area in the second optical areas OA2 can be greater than or equal to the number of subpixels per unit area in the first optical areas OA1.

In each of FIGS. 1A, 1B, and 1C, the first optical area OA1 can have various shapes, such as a circle, an ellipse, a quadrangle, a hexagon, an octagon or the like. In each of FIGS. 1B, and 1C, the second optical area OA2 can have various shapes, such as a circle, an ellipse, a quadrangle, a hexagon, an octagon or the like. The first optical area OA1 and the second optical area OA2 can have the same shape or different shapes.

Referring to FIG. 1C, in the example where the first optical area OA1 and the second optical area OA2 contact each other, the entire optical area including the first optical area OA1 and the second optical area OA2 can also have various shapes, such as a circle, an ellipse, a quadrangle, a hexagon, an octagon, a racetrack shape or the like.

Hereinafter, for convenience of description, discussions will be provided based on embodiments in which each of the first optical area OA1 and the second optical area OA2 has a circular shape. It should be, however, understood that the scope of the present disclosure includes embodiments where one or both of the first optical area OA1 and the second optical area OA2 have a shape other than a circular shape.

In examples where the display device 100 according to aspects of the present disclosure has a structure in which the first optical electronic device 11 such as a camera, and the like is located under, or in a lower portion of, the display panel PNL without being exposed to the outside, such a display device 100 according to aspects of the present disclosure can be referred to as a display in which under-display camera (UDC) technology is implemented.

According to these examples, the display device 100 according to aspects of the present disclosure can have an advantage of preventing the size of the display area DA from being reduced because a notch or a camera hole for exposing a camera need not be formed in the display panel PNL.

Since the notch or the camera hole for camera exposure need not be formed in the display panel PNL, the display device 100 can have further advantages of reducing the size of the bezel area, and improving the degree of freedom in design as such limitations to the design are removed.

Although the one or more optical electronic devices (11 and/or 12) are located to be covered on the back of (under, embedded within, or in the lower portion of) the display panel PNL in the display device 100 according to aspects of the present disclosure, that is, hidden not to be exposed to the outside, the one or more optical electronic devices (11 and/or 12) need to be able to receive or detect light for performing predefined functionality normally.

Further, in the display device 100 according to aspects of the present disclosure, although the one or more optical electronic devices (11 and/or 12) are located to be covered on the back of (under, or in the lower portion of) the display panel PNL and located to overlap the display area DA, it is necessary for image display to be normally performed in the one or more optical areas (OA1 and/or OA2) overlapping the one or more optical electronic devices (11 and/or 12) in the area DA.

Figure 2:
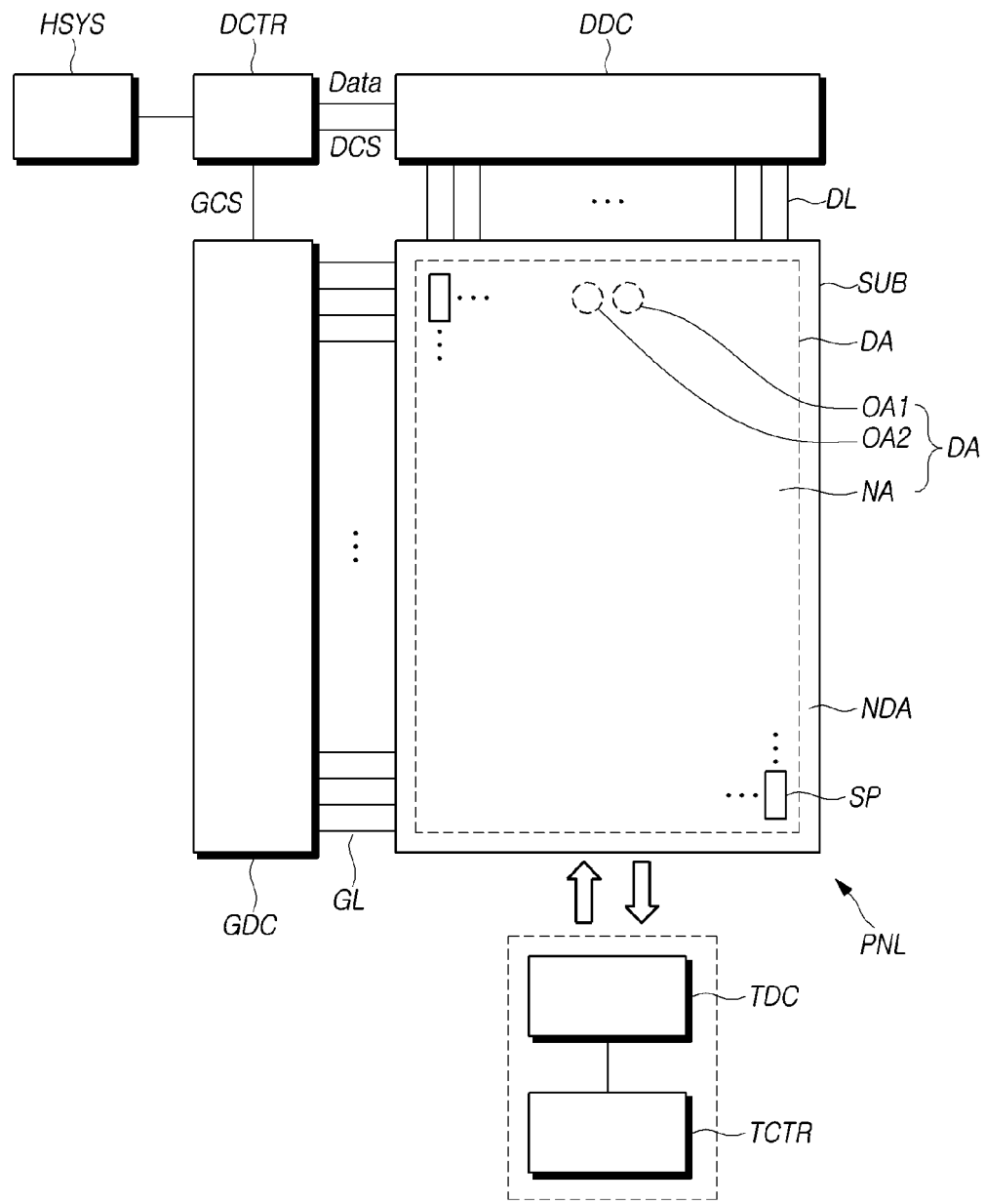
FIG. 2 illustrates an example system configuration of the display device according to aspects of the present disclosure.

FIG. 2 illustrates an example system configuration of the display device 100 according to aspects of the present disclosure.

Referring to FIG. 2, the display device 100 can include the display panel PNL and a display driving circuit as components for displaying an image.

The display driving circuit is a circuit for driving the display panel PNL, and can include a data driving circuit DDC, a gate driving circuit GDC, a display controller DCTR, and other components.

The display panel PNL can include a display area DA in which an image is displayed and a non-display area NDA in which an image is not displayed. The non-display area NDA can be an area outside of the display area DA, and can also be referred to as an edge area or a bezel area. All or a portion of the non-display area NDA can be an area visible from the front surface of the display device 100, or an area that is bent and invisible from the front surface of the display device 100.

The display panel PNL can include a substrate SUB and a plurality of subpixels SP disposed on the substrate SUB. The display panel PNL can further include various types of signal lines to drive the plurality of subpixels SP.

In some embodiments, the display device 100 herein can be a liquid crystal display device, or the like, or a self-emission display device in which light is emitted from the display panel PNL itself. In some embodiments, when the display device 100 is the self-emission display device, each of the plurality of subpixels SP can include a light emitting element.

In one embodiment, the display device 100 according to aspects of the present disclosure can be an organic light emitting display device in which the light emitting element is implemented using an organic light emitting diode (OLED). In another embodiment, the display device 100 according to aspects of the present disclosure can be an inorganic light emitting display device in which the light emitting element is implemented using an inorganic material-based light emitting diode. In further another embodiment, the display device 100 according to aspects of the present disclosure can be a quantum dot display device in which the light emitting element is implemented using quantum dots, which are self-emission semiconductor crystals.

The structure of each of the plurality of subpixels SP can vary according to types of the display devices 100. For example, when the display device 100 is a self-emission display device including self-emission subpixels SP, each subpixel SP can include a self-emission light emitting element, one or more transistors, and one or more capacitors.

The various types of signal lines arranged in the display device 100 can include, for example, a plurality of data lines DL for carrying data signals (which can be referred to as data voltages or image signals), a plurality of gate lines GL for carrying gate signals (which can be referred to as scan signals), and the like.

The plurality of data lines DL and the plurality of gate lines GL can intersect each other. Each of the plurality of data lines DL can extend in a first direction. Each of the plurality of gate lines GL can extend in a second direction.

For example, the first direction can be a column or vertical direction, and the second direction can be a row or horizontal direction. In another example, the first direction can be the row direction, and the second direction can be the column direction.

The data driving circuit DDC is a circuit for driving the plurality of data lines DL, and can supply data signals to the plurality of data lines DL. The gate driving circuit GDC is a circuit for driving the plurality of gate lines GL, and can supply gate signals to the plurality of gate lines GL.

The display controller DCTR can be a device for controlling the data driving circuit DDC and the gate driving circuit GDC, and can control driving timing for the plurality of data lines DL and driving timing for the plurality of gate lines GL.

The display controller DCTR can supply a data driving control signal DCS to the data driving circuit DDC to control the data driving circuit DDC, and supply a gate driving control signal GCS to the gate driving circuit GDC to control the gate driving circuit GDC.

The display controller DCTR can receive input image data from a host system HSYS and supply image data Data to the data driving circuit DDC based on the input image data.

The data driving circuit DDC can supply data signals to the plurality of data lines DL according to driving timing control of the display controller DCTR.

The data driving circuit DDC can receive the digital image data Data from the display controller DCTR, convert the received image data Data into analog data signals, and supply the resulting analog data signals to the plurality of data lines DL.

The gate driving circuit GDC can supply gate signals to the plurality of gate lines GL according to timing control of the display controller DCTR. The gate driving circuit GDC can receive a first gate voltage corresponding to a turn-on level voltage and a second gate voltage corresponding to a turn-off level voltage along with various gate driving control signals GCS, generate gate signals, and supply the generated gate signals to the plurality of gate lines GL.

In some embodiments, the data driving circuit DDC can be connected to the display panel PNL in a tape automated bonding (TAB) type, or connected to a conductive pad such as a bonding pad of the display panel PNL in a chip on glass (COG) type or a chip on panel (COP) type, or connected to the display panel PNL in a chip on film (COF) type.

In some embodiments, the gate driving circuit GDC can be connected to the display panel PNL in the tape automated bonding (TAB) type, or connected to a conductive pad such as a bonding pad of the display panel PNL in the chip on glass (COG) type or the chip on panel (COP) type, or connected to the display panel PNL in the chip on film (COF) type. In another embodiment, the gate driving circuit GDC can be disposed in the non-display area NDA of the display panel PNL in a gate in panel (GIP) type. The gate driving circuit GDC can be disposed on or over the substrate, or connected to the substrate. That is, in the situation of the GIP type, the gate driving circuit GDC can be disposed in the non-display area NDA of the substrate. The gate driving circuit GDC can be connected to the substrate in the situation of the chip on glass (COG) type, the chip on film (COF) type, or the like.

In some embodiments, at least one of the data driving circuit DDC and the gate driving circuit GDC can be disposed in the display area DA of the display panel PNL. For example, at least one of the data driving circuit DDC and the gate driving circuit GDC can be disposed not to overlap with the subpixels SP, or disposed to be overlapped with one or more, or all, of the subpixels SP.

The data driving circuit DDC can also be located on, but not limited to, only one side or portion (e.g., an upper edge or a lower edge) of the display panel PNL. In some embodiments, the data driving circuit DDC can be located in, but not limited to, two sides or portions (e.g., an upper edge and a lower edge) of the display panel PNL or at least two of four sides or portions (e.g., the upper edge, the lower edge, a left edge, and a right edge) of the display panel PNL according to driving schemes, panel design schemes, or the like.

The gate driving circuit GDC can be located in only one side or portion (e.g., a left edge or a right edge) of the display panel PNL. In some embodiments, the gate driving circuit GDC can be connected to two sides or portions (e.g., a left edge and a right edge) of the display panel PNL, or be connected to at least two of four sides or portions (e.g., an upper edge, a lower edge, the left edge, and the right edge) of the display panel PNL according to driving schemes, panel design schemes, or the like.

The display controller DCTR can be implemented in a separate component from the data driving circuit DDC, or integrated with the data driving circuit DDC and thus implemented in an integrated circuit.

The display controller DCTR can be a timing controller used in the typical display technology or a controller or a control device capable of performing other control functions in addition to the function of the typical timing controller. In some embodiments, the display controller DCTR can be a controller or a control device different from the timing controller, or a circuitry or a component included in the controller or the control device. The display controller DCTR can be implemented with various circuits or electronic components such as an integrated circuit (IC), a field programmable gate array (FPGA), an application specific integrated circuit (ASIC), a processor, and/or the like.

The display controller DCTR can be mounted on a printed circuit board, a flexible printed circuit, and/or the like and be electrically connected to the gate driving circuit DDC and the data driving circuit GDC through the printed circuit board, flexible printed circuit, and/or the like.

The display controller DCTR can transmit signals to, and receive signals from, the data driving circuit DDC via one or more predefined interfaces. In some embodiments, such interfaces can include a low voltage differential signaling (LVDS) interface, an embedded clock point-point interface (EPI), a serial peripheral interface (SPI), and the like.

In some embodiments, in order to further provide a touch sensing function, as well as an image display function, the display device 100 can include at least one touch sensor, and a touch sensing circuit capable of detecting whether a touch event occurs by a touch object such as a finger, a pen, or the like, or of detecting a corresponding touch position, by sensing the touch sensor.

The touch sensing circuit can include a touch driving circuit TDC capable of generating and providing touch sensing data by driving and sensing the touch sensor, a touch controller TCTR capable of detecting the occurrence of a touch event or detecting a touch position using the touch sensing data, and one or more other components.

The touch sensor can include a plurality of touch electrodes. The touch sensor can further include a plurality of touch lines for electrically connecting the plurality of touch electrodes to the touch driving circuit TDC.

The touch sensor can be implemented in the form of a touch panel, outside of the display panel PNL, or be implemented inside of the display panel PNL. In the example where the touch sensor is implemented in the form of the touch panel, outside of the display panel PNL, such a touch sensor is referred to as an add-on type. In the example where the add-on type of touch sensor is disposed, the touch panel and the display panel PNL can be separately manufactured and coupled during an assembly process. The add-on type of touch panel can include a touch panel substrate and a plurality of touch electrodes on the touch panel substrate.

In the example where the touch sensor is implemented inside of the display panel PNL, a process of manufacturing the display panel PNL can include disposing the touch sensor over the substrate SUB together with signal lines and electrodes related to driving the display device 100.

The touch driving circuit TDC can supply a touch driving signal to at least one of the plurality of touch electrodes, and sense at least one of the plurality of touch electrodes to generate touch sensing data.

The touch sensing circuit can perform touch sensing using a self-capacitance sensing technique or a mutual-capacitance sensing technique.

In the example where the touch sensing circuit performs touch sensing in the self-capacitance sensing technique, the touch sensing circuit can perform touch sensing based on capacitance between each touch electrode and a touch object (e.g., a finger, a pen, and the like).

According to the self-capacitance sensing method, each of the plurality of touch electrodes can serve as both a driving touch electrode and a sensing touch electrode. The touch driving circuit TDC can drive all, or one or more, of the plurality of touch electrodes and sense all, or one or more, of the plurality of touch electrodes.

In the example where the touch sensing circuit performs touch sensing in the mutual-capacitance sensing technique, the touch sensing circuit can perform touch sensing based on capacitance between touch electrodes.

According to the mutual-capacitance sensing method, the plurality of touch electrodes are divided into driving touch electrodes and sensing touch electrodes. The touch driving circuit TDC can drive the driving touch electrodes and sense the sensing touch electrodes.

The touch driving circuit TDC and the touch controller TCTR included in the touch sensing circuit can be implemented in separate devices or in a single device. Further, the touch driving circuit TDC and the data driving circuit DDC can be implemented in separate devices or in a single device.

The display device 100 can further include a power supply circuit for supplying various types of power to the display driving circuit and/or the touch sensing circuit.

In some embodiments, the display device 100 can be a mobile terminal such as a smart phone, a tablet, or the like, or a monitor, a television (TV), or the like. Such devices can be of various types, sizes, and shapes. The display device 100 according to embodiments of the present disclosure are not limited thereto, and includes displays of various types, sizes, and shapes for displaying information or images.

As described above, the display area DA of the display panel PNL can include a normal area (e.g., the normal area NA of FIGS. 1A, 1B and 1C) and one or more optical areas (e.g., the first and/or second optical areas OA1 and/or OA2 of FIGS. 1A, 1B and 1C).

The normal area NA and the one or more optical areas (OA1 and/or OA2) are areas where an image can be displayed. However, the normal NA is an area in which a light transmission structure need not be implemented, and the one or more optical areas (OA1 and/or OA2) are areas in which the light transmission structure need be implemented.

As discussed above with respect to the examples of FIGS. 1A, 1B, and 1C, although the display area DA of the display panel PNL can include the one or more optical areas (OA1 and/or OA2) in addition to the normal area NA, for convenience of description, in discussions that follow, it is assumed that the display area DA includes first and second optical areas (OA1 and OA2) and the normal area NA; and the normal area NA thereof includes the normal areas NAs in FIGS. 1A to 1C, and the first and second optical areas (OA1, OA2) thereof include the first optical areas OA1s in FIGS. 1A, 1B, and 1C and the second optical areas OA2s of FIGS. 1B and 1C, respectively, unless explicitly stated otherwise.

FIG. 3 illustrates an example equivalent circuit of a subpixel SP in the display panel PNL according to aspects of the present disclosure. In FIG. 3, the configuration of a Y circuit is the same as the configuration of an X circuit except that anode electrodes AE of two light emitting elements are connected to one driving transistor DRT, and thus, the two light emitting elements ED are driven by the one transistor.

Each of subpixels SP disposed in the normal area NA, the first optical area OA1, and the second optical area OA2 included in the display area DA of the display panel PNL can include a light emitting element ED, a driving transistor DRT for driving the light emitting element ED, a scan transistor SCT for transmitting a data voltage Vdata to a first node N1 of the driving transistor DRT, a storage capacitor Cst for maintaining a voltage at an approximate constant level during one frame, and the like.

The driving transistor DRT can include the first node N1 to which a data voltage is applied, a second node N2 electrically connected to the light emitting element ED, and a third node N3 to which a driving voltage ELVDD through a driving voltage line DVL is applied. In the driving transistor DRT, the first node N1 can be a gate node, the second node N2 can be a source node or a drain node, and the third node N3 can be the drain node or the source node.

The light emitting element ED can include an anode electrode AE, an emission layer EL, and a cathode electrode CE. The anode electrode AE can be a pixel electrode disposed in each subpixel SP, and can be electrically connected to the second node N2 of the driving transistor DRT of each subpixel SP. The cathode electrode CE can be a common electrode commonly disposed in the plurality of subpixels SP, and a base voltage ELVSS such as a low-level voltage can be applied to the cathode electrode CE.

For example, the anode electrode AE can be the pixel electrode, and the cathode electrode CE can be the common electrode. In another example, the anode electrode AE can be the common electrode, and the cathode electrode CE can be the pixel electrode. For convenience of description, in discussions that follow, it is assumed that the anode electrode AE is the pixel electrode, and the cathode electrode CE is the common electrode unless explicitly stated otherwise.

The light emitting element ED can be, for example, an organic light emitting diode (OLED), an inorganic light emitting diode, a quantum dot light emitting element, or the like. In the example where an organic light emitting diode is used as the light emitting element ED, the emission layer EL included in the light emitting element ED can include an organic emission layer including an organic material.

The scan transistor SCT can be turned on and off by a scan signal SCAN that is a gate signal applied through a gate line GL, and be electrically connected between the first node N1 of the driving transistor DRT and a data line DL.

The storage capacitor Cst can be electrically connected between the first node N1 and the second node N2 of the driving transistor DRT.

Each subpixel SP can include two transistors (2T: DRT and SCT) and one capacitor (1C: Cst) (which can be referred to as a "2T1C structure") as illustrated in FIG. 3, and in some situations, can further include one or more transistors, or further include one or more capacitors (e.g., for performing characteristic sensing and compensation).

In some embodiments, the storage capacitor Cst, which can be present between the first node N1 and the second node N2 of the driving transistor DRT, can be an external capacitor intentionally configured or designed to be located outside of the driving transistor DRT, other than internal capacitors, such as parasitic capacitors (e.g., a gate-to-source capacitance Cgs, a gate-to-drain capacitance Cgd, and the like).

Each of the driving transistor DRT and the scan transistor SCT can be an n-type transistor or a p-type transistor.

Since circuit elements (e.g., in particular, a light emitting element ED) in each subpixel SP are vulnerable to external moisture or oxygen, an encapsulation layer ENCAP can be disposed in the display panel PNL in order to prevent the external moisture or oxygen from penetrating into the circuit elements (e.g., in particular, the light emitting element ED). The encapsulation layer ENCAP can be disposed to cover the light emitting element ED.

In some embodiments, as a method for increasing a transmittance of at least one of the first optical area OA1 and the second optical area OA2, a technique (which can be referred to as a "pixel density differentiation design scheme") can be applied so that a density of pixels (or subpixels) or a degree of integration of pixels (or subpixels) can be differentiated as described above. According to the pixel density differentiation design scheme, in one embodiment, the display panel PNL can be designed such that the number of subpixels per unit area of at least one of the first optical area OA1 and the second optical area OA2 is greater than the number of subpixels per unit area of the normal area NA (e.g., in order to pass more light through to the optical electronic devices).

In another embodiment, as another method for increasing a transmittance of at least one of the first optical area OA1 and the second optical area OA2, another technique (which can be referred to as a "pixel size differentiation design scheme") can be applied so that a size of a pixel (or a subpixel) can be differentiated. According to the pixel size differentiation design scheme, the display panel PNL can be designed such that the number of subpixels per unit area of at least one of the first optical area OA1 and the second optical area OA2 is equal to or similar to the number of subpixels per unit area of the normal area NA; however, a size of each subpixel SP (e.g., a size of a corresponding light emitting area) disposed in at least one of the first optical area OA1 and the second optical area OA2 is smaller than a size of each subpixel SP (e.g., a size of a corresponding light emitting area) disposed in the normal area NA (e.g., in order to pass more light through to the optical electronic devices).

For convenience of description, discussions that follow are provided based on the pixel density differentiation design scheme of the two schemes (e.g., the pixel density differentiation design scheme and the pixel size differentiation design scheme) for increasing the transmittance of at least one of the first optical area OA1 and the second optical area OA2, unless explicitly stated otherwise.

Figure 4:
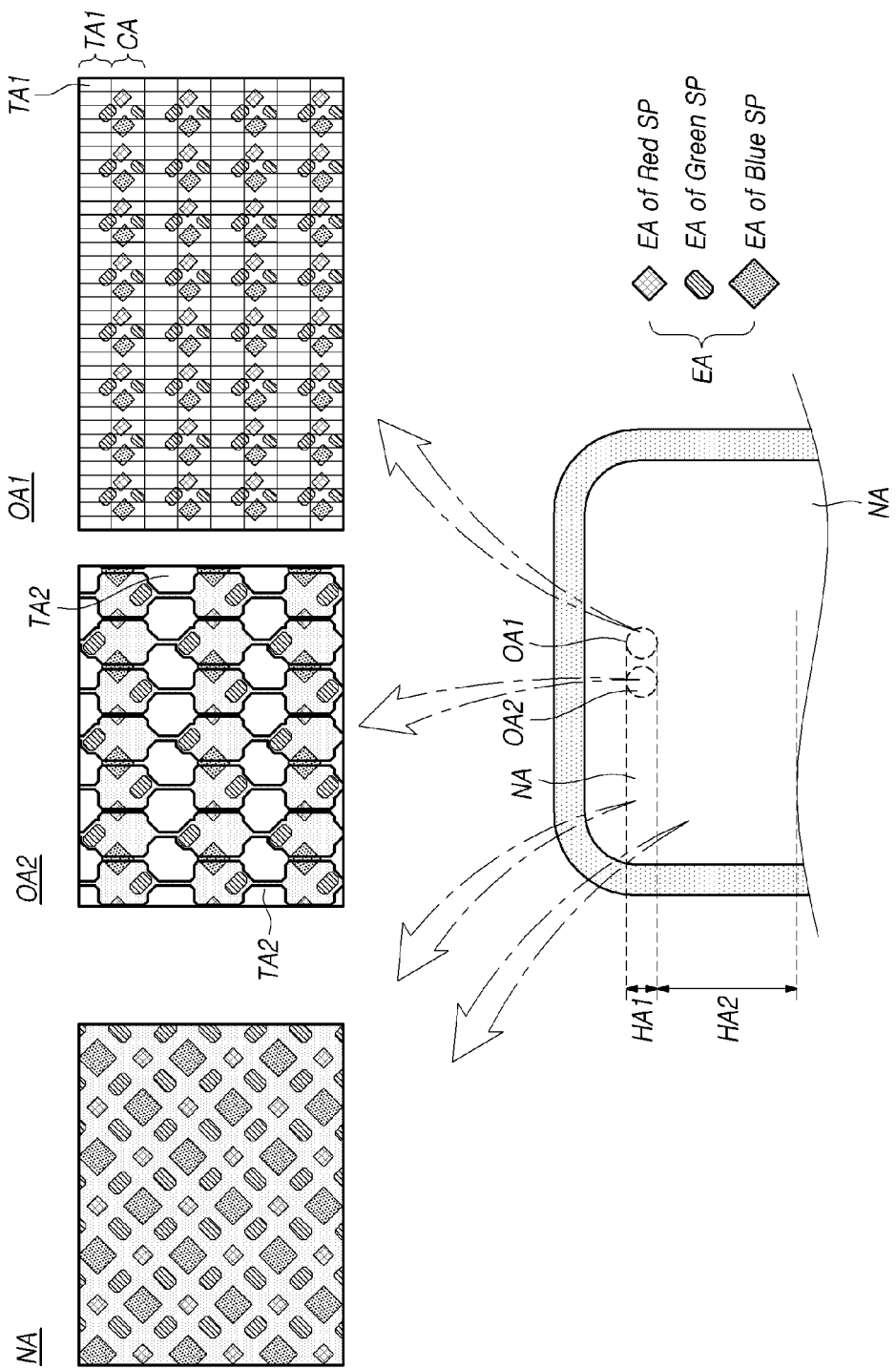
FIG. 4 illustrates example arrangements of subpixels in three areas included in a display area of the display device according to aspects of the present disclosure.

FIG. 4 illustrates example arrangements of subpixels SP in the three areas (NA, OA1, and OA2) included in the display area DA of the display panel PNL according to aspects of the present disclosure.

Referring to FIG. 4, in some embodiments, a plurality of subpixels SP can be disposed in each of the normal area NA, the first optical area OA1, and the second optical area OA2 included in the display area DA.

The plurality of subpixels SP can include, for example, a red subpixel (Red SP) emitting red light, a green subpixel (Green SP) emitting green light, and a blue subpixel (Blue SP) emitting blue light.

Accordingly, each of the normal area NA, the first optical area OA1, and the second optical area OA2 can include one or more light emitting areas EA of one or more red subpixels (Red SP), and one or more light emitting areas EA of one or more green subpixels (Green SP), and one or more light emitting areas EA of one or more blue subpixels (Blue SP).

Referring to FIG. 4, in some embodiments, the normal area NA may not include a light transmission structure, but can include light emitting areas EA.

In contrast, in some embodiments, the first optical area OA1 and the second optical area OA2 need to include both the light emitting areas EA and the light transmission structure.

Accordingly, the first optical area OA1 can include one or more light emitting areas EA and one or more first transmission areas TA1, and the second optical area OA2 can include one or more light emitting areas EA and one or more second transmission areas TA2.

The first optical area OA1 can include a circuit area CA. The circuit area CA can be an area in which one or more lines for connecting one or more transistors included in each subpixel or one or more circuit elements included in each subpixel are located. The first transmission area TA1 and the circuit area CA can be alternately and repeatedly located (e.g., in alternating rows).

The light emitting areas EA and the transmission areas (TA1 and/or TA2) can be distinct according to whether the transmission of light is allowed. For example, the light emitting areas EA can be areas not allowing light to transmit through (e.g., blocking or not allowing light to transmit through to the back or rear side of the display panel), and the transmission areas (TA1 and/or TA2) can be areas that do allow light to transmit or pass through (e.g., allowing light to transmit through to the back or rear side of the display panel).

The light emitting areas EA and the transmission areas (TA1 and/or TA2) can be also distinct according to whether or not a specific metal layer is included. For example, the cathode electrode CE as illustrated in FIG. 3 can be disposed in the light emitting areas EA, and the cathode electrode CE may not be disposed in the transmission areas (TA1 and/or TA2). In some embodiments, a light shield layer can be disposed in the light emitting areas EA, and a light shield layer may not be disposed in the transmission areas (TA1 and/or TA2).

Since the first optical area OA1 includes the first transmission areas TA1 and the second optical area OA2 includes the second transmission areas TA2, both of the first optical area OA1 and the second optical area OA2 are areas through which light can transmit or pass through.

In one embodiment, a transmittance (a degree of transmission) of the first optical area OA1 and a transmittance (a degree of transmission) of the second optical area OA2 can be substantially equal.

For example, the first transmission area TA1 of the first optical area OA1 and the second transmission area TA2 of the second optical area OA2 can have substantially the same shape or size. In another example, even when the first transmission area TA1 of the first optical area OA1 and the second transmission area TA2 of the second optical area OA2 have different shapes or sizes, a ratio of the first transmission area TA1 to the first optical area OA1 and a ratio of the second transmission area TA2 to the second optical area OA2 can be substantially equal. In an example, each of the first transmission areas TA1s has the same shape and size. In an example, each of the second transmission areas TA2s has the same shape and size.

In another embodiment, a transmittance (a degree of transmission) of the first optical area OA1 and a transmittance (a degree of transmission) of the second optical area OA2 can be different.

For example, the first transmission area TA1 of the first optical area OA1 and the second transmission area TA2 of the second optical area OA2 can have different shapes or sizes. In another example, even when the first transmission area TA1 of the first optical area OA1 and the second transmission area TA2 of the second optical area OA2 have substantially the same shape or size, a ratio of the first transmission area TA1 to the first optical area OA1 and a ratio of the second transmission area TA2 to the second optical area OA2 can be different from each other.

For example, in the example where the first optical electronic device 11, as illustrated in FIGS. 1A, 1B and 1C, overlapping the first optical area OA1 is a camera, and the second optical electronic device 12, as illustrated in FIGS. 1B and 1C, overlapping the second optical area OA2 is a sensor for detecting images, objects or an amount of light, the camera may need a greater amount of light than the sensor.

Thus, the transmittance (degree of transmission) of the first optical area OA1 can be greater than the transmittance (degree of transmission) of the second optical area OA2.

For example, the first transmission area TA1 of the first optical area OA1 can have a size that is greater than a size of the second transmission area TA2 of the second optical area OA2. In another example, even when the first transmission area TA1 of the first optical area OA1 and the second transmission area TA2 of the second optical area OA2 have substantially the same size, a ratio of the first transmission area TA1 to the first optical area OA1 can be greater than a ratio of the second transmission area TA2 to the second optical area OA2.

For convenience of description, discussions that follow are provided based on the embodiment in which the transmittance (degree of transmission) of the first optical area OA1 is greater than the transmittance (degree of transmission) of the second optical area OA2 (e.g., OA1 can allow more light to pass through it than OA2).

Further, the transmission areas (TA1, TA2) as shown in FIG. 4 can be referred to as transparent areas, and the term transmittance can be referred to as transparency.

Further, in discussions that follow, it is assumed that the first optical areas OA1 and the second optical areas OA2 are located in an upper edge of the display area DA of the display panel PNL, and are disposed to be horizontally adjacent to each other, such as being disposed in a direction in which the upper edge extends, as shown in FIG. 4, unless explicitly stated otherwise. But the embodiments of the present disclosure are not limited thereto. For example, the first optical areas OA1 and the second optical areas OA2 can be located in any position, such as the upper edge, the lower edge, the left edge, the right edge and the central region, of the display area DA of the display panel PNL. For example, the first optical areas OA1 and the second optical areas OA2 can be arranged along any direction in the display panel PNL.

Referring to FIG. 4, a horizontal display area in which the first optical area OA1 and the second optical area OA2 are disposed is referred to as a first horizontal display area HAL and another horizontal display area in which the first optical area OA1 and the second optical area OA2 are not disposed is referred to as a second horizontal display area HA2.

Referring to FIG. 4, the first horizontal display area HA1 can include a portion of the normal area NA, the first optical area OA1, and the second optical area OA2. The second horizontal display area HA2 can include only the normal area NA.

FIG. 5A illustrates example arrangements of signal lines in each of a first optical area (e.g., the first optical area OA1 in the figures discussed above) and a normal area (e.g., the normal area NA in the figures discussed above) of the display panel PNL according to aspects of the present disclosure. FIG. 5B illustrates example arrangements of signal lines in each of a second optical area (e.g., the second optical area OA2 in the figures discussed above) and the normal area NA of the display panel PNL according to aspects of the present disclosure.

A first horizontal display area HA1 shown in FIGS. 5A and 5B is a portion of a first horizontal display area (e.g., the first horizontal display area HA1 of FIG. 4) of the display panel PNL, and a second horizontal display area HA2 is a portion of a second horizontal display area (e.g., the second horizontal display area HA2 of FIG. 4) of the display panel PNL.

The first optical area OA1 shown in FIG. 5A is a portion of a first optical area (e.g., the first optical area OA1 in the figures discussed above) of the display panel PNL, and the second optical area OA2 shown in FIG. 5B is a portion of a second optical area (e.g., the second optical area OA2 in the figures discussed above) of the display panel PNL.

Referring to FIGS. 5A and 5B, the first horizontal display area HA1 can include a portion of the normal area NA, the first optical area OA1, and the second optical area OA2. The second horizontal display area HA2 can include only the normal area NA.

Various types of horizontal lines (HL1 and HL2) and various types of vertical lines (VLn, VL1, and VL2) can be disposed in the display panel PNL.

In some embodiments, the term "horizontal" and the term "vertical" are used to refer to two directions in parallel with the display panel; however, it should be noted that the horizontal direction and the vertical direction can be changed depending on a viewing direction. The horizontal direction can refer to, for example, a direction in which one gate line GL extends and, and the vertical direction can refer to, for example, a direction in which one data line DL extends. As such, the term horizontal and the term vertical are used to represent two directions.

Referring to FIGS. 5A and 5B, the horizontal lines disposed in the display panel PNL can include first horizontal lines HL1 disposed in the first horizontal display area HA1 and second horizontal lines HL2 disposed in the second horizontal display area HA2.

The horizontal lines disposed in the display panel PNL can be gate lines GL (which can be referred to as scan lines). That is, the first horizontal lines HL1 and the second horizontal lines HL2 can be the gate lines GL. The gate lines GL can include various types of gate lines according to structures of one or more subpixels SP. The plurality of horizontal lines can substantially horizontal or can be disposed vertically or diagonal.

Referring to FIGS. 5A and 5B, the vertical lines disposed in the display panel PNL can include normal vertical lines VLn disposed only in the normal area NA, first vertical lines VL1 running through both of the first optical area OA1 and the normal area NA, and second vertical lines VL2 running through both of the second optical area OA2 and the normal area NA.

The vertical lines disposed in the display panel PNL can include data lines DL, driving voltage lines DVL, and the like, and can further include reference voltage lines, initialization voltage lines, and the like. That is, the normal vertical lines VLn, the first vertical lines VL1 and the second vertical lines VL2 can include data lines DL, driving voltage lines DVL, and the like, and further include reference voltage lines, initialization voltage lines, and the like (e.g., for performing sampling and compensation).

In some embodiments, it should be noted that the term "horizontal" in the second horizontal line HL2 can mean only that a signal is carried from a left side, to a right side, of the display panel (or from the right side to the left side), and may not mean that the second horizontal line HL2 runs in a straight line only in the direct horizontal direction. For example, in FIGS. 5A and 5B, although the second horizontal lines HL2 are illustrated in a straight line, one or more of the second horizontal lines HL2 can include one or more bent or folded portions that are different from the configurations shown in FIGS. 5A and 5B. Likewise, one or more of the first horizontal lines HL1 can also include one or more bent or folded portions.

In some embodiments, it should be noted that the term "vertical" in the typical vertical line VLn can mean only that a signal is carried from an upper portion, to a lower portion, of the display panel (or from the lower portion to the upper portion), and may not mean that the typical vertical line VLn runs in a straight line only in the direct vertical direction. For example, in FIGS. 5A and 5B, although the typical vertical lines VLn are illustrated in a straight line, one or more of the typical vertical lines VLn can include one or more bent or folded portions that are different from the configurations shown in FIGS. 5A and 5B. Likewise, one or more of the first vertical line VL1 and one or more of the second vertical line VL2 can also include one or more bent or folded portions.

Referring to FIG. 5A, the first optical area OA1 included in the first horizontal area HA1 can include light emitting areas EA, as shown in FIG. 4, and first transmission areas TA1. In the first optical area OA1, respective outer areas of the first transmission areas can be included in light emitting areas EA.

Referring to FIG. 5A, in order to improve the transmittance of the first optical area OA1, the first horizontal lines HL1 can run through the first optical area OA1 while avoiding the first transmission areas TA1 in the first optical area OA1. For example, the first horizontal lines HL1 can be arranged in a plurality of groups, in which the lines within one group are spaced close together and arranged between two rows of first transmission areas TA1.

Alternatively, each of the first horizontal lines HL1 running through the first optical area OA1 can include one or more curved or bent portions running around one or more respective outer edges of one or more of the first transmission areas TA1 (e.g., similar to the wiring arrangement shown in FIG. 5B).

Accordingly, the first horizontal lines HL1 disposed in the first horizontal area HA1 and the second horizontal lines HL2 disposed in the second horizontal display area HA2 can have different shapes or lengths. For example, the first horizontal lines HL1 running through the first optical area OA1 and the second horizontal lines HL2 not running through the first optical area OA1 can have different shapes or lengths.

Further, in order to improve the transmittance of the first optical area OA1, the first vertical lines VL1 can run through the first optical area OA1 while avoiding the first transmission areas TA1 in the first optical area OA1. For example, the first vertical lines VL1 can be arranged in a plurality of groups, in which the lines within one group are spaced close together and arranged between two columns of first transmission areas TA1.

Alternatively, each of the first vertical lines VL1 running through the first optical area OA1 can include one or more curved or bent portions running around one or more respective outer edges of one or more of the first transmission areas TA1 (e.g., similar to the wiring arrangement shown in FIG. 5B).

Thus, the first vertical lines VL1 running through the first optical area OA1 and the normal vertical lines VLn disposed in the normal area NA without running through the first optical area OA1 can have different shapes or lengths.

Referring to FIG. 5A, the first transmission areas TA1 included in the first optical area OA1 in the first horizontal area HA1 can be arranged in a diagonal direction.

Referring to FIG. 5A, in the first optical area OA1 in the first horizontal area HAL one or more light emitting areas EA can be disposed between two horizontally adjacent first transmission areas TA1. In the first optical area OA1 in the first horizontal area HAL one or more light emitting areas EA can be disposed between two first transmission areas TA1 adjacent to each other in up and down directions (e.g., two vertically-adjacent first transmission areas TA1).

Also, each of the first horizontal lines HL1 disposed in the first horizontal area HA1 (e.g., each of the first horizontal lines HL1 running through the first optical area OA1) can include one or more curved or bent portions running around one or more respective outer edges of one or more of the first transmission areas TA1. Also, the first horizontal lines HL1 disposed in the first horizontal display area HA1 can be spaced closer to together in order avoid interference with light passing through the first transmission areas TA1.

Referring to FIG. 5B, the second optical area OA2 included in the first horizontal area HA1 can include light emitting areas EA and second transmission areas TA2. In the second optical area OA2, respective outer areas of the second transmission areas TA2 can be included in or adjacent to or between light emitting areas EA.

In one embodiment, the light emitting areas EA and the second transmission areas TA2 in the second optical area OA2 can have substantially the same locations and arrangements as the light emitting areas EA and the first transmission areas TA1 in the first optical area OA1 of FIG. 5A.

In another embodiment, as shown in FIG. 5B, the light emitting areas EA and the second transmission areas TA2 in the second optical area OA2 can have locations and arrangements different from the light emitting areas EA and the first transmission areas TA1 in the first optical area OA1 of FIG. 5A.

For example, referring to FIG. 5B, the second transmission areas TA2 in the second optical area OA2 can be arranged in the horizontal direction, such as being disposed in a row (the left to right or right to left direction). In this example, a light emitting area EA may not be disposed between two second transmission areas TA2 adjacent to each other in left and right directions (e.g., the horizontal direction). Further, one or more of the light emitting areas EA in the second optical area OA2 can be disposed between second transmission areas TA2 adjacent to each other in up and down directions (e.g., the vertical direction). For example, one or more light emitting areas EA can be disposed between two rows of second transmission areas TA2.

When in the first horizontal area HAL the first horizontal lines HL1 run through the second optical area OA2 and the normal area NA adjacent to the second optical area OA2, in one embodiment, the first horizontal lines HL1 can have substantially the same arrangement as the first horizontal lines HL1 of FIG. 5A.

In another embodiment, as shown in FIG. 5B, when in the first horizontal area HAL running through the second optical area OA2 and the normal area NA adjacent to the second optical area OA2, the first horizontal lines HL1 can have an arrangement different from the first horizontal lines HL1 of FIG. 5A. For example, wiring lines in the second optical area OA2 can have curved shapes in order to provide open areas for transmitting light, and wiring lines first optical area OA1 can be spaced close together in groups in order to provide open areas for transmitting light.

This is because the light emitting areas EA and the second transmission areas TA2 in the second optical area OA2 of FIG. 5B have locations and arrangements different from the light emitting areas EA and the first transmission areas TA1 in the first optical area OA1 of FIG. 5A.

Referring to FIG. 5B, when in the first horizontal area HA1, the first horizontal lines HL1 run through the second optical area OA2 and the normal area NA adjacent to the second optical area OA2, the first horizontal lines HL1 can run between vertically adjacent second transmission areas TA2 in a straight line without having a curved or bent portion. For example, a group of horizontal lines HL1 can be disposed between two rows of second transmission areas TA2.

According to another example, one first horizontal line HL1 can have one or more curved or bent portions in the first optical area OA1 (e.g., similar to the arrangement of lines VL2 in FIG. 5B), but may not have a curved or bent portion in the second optical area OA2 (e.g., can be straight). Similarly, as shown in FIGS. 5A and 5B, vertical wiring lines can have one or more curved or bent portions in the second optical area OA2, but may not have a curved or bent portion in the first optical area OA1 and can have straight portions in the first optical area OA1.

In order to improve the transmittance of the second optical area OA2, the second vertical lines VL2 can run through the second optical area OA2 while avoiding the second transmission areas TA2 in the second optical area OA2 (e.g., the second vertical lines VL2 can bend around the second transmission areas TA2).

Accordingly, each of the second vertical lines VL2 running through the second optical area OA2 can include one or more curved or bent portions running around one or more respective outer edges of one or more of the second transmission areas TA2.

Thus, the second vertical lines VL2 running through the second optical area OA2 and the normal vertical lines VLn disposed in the normal area NA without running through the second optical area OA2 can have different shapes or lengths.

As an alternative to the arrangement shown in FIG. 5A, each, or one or more, of the first horizontal lines HL1 running through the first optical area OA1 can have one or more curved or bent portions running around one or more respective outer edges of one or more of the first transmission areas TA1 (e.g., similar to the wirings shown in FIG. 5B).

Accordingly, a length of the first horizontal line HL1 running through the first optical area OA1 and the second optical area OA2 can be slightly longer than a length of the second horizontal line HL2 disposed only in the normal area NA without running through the first optical area OA1 and the second optical area OA2.

Accordingly, a resistance of the first horizontal line HL1 running through the first optical area OA1 and the second optical area OA2, which is referred to as a first resistance, can be slightly greater than a resistance of the second horizontal line HL2 disposed only in the normal area NA without running through the first optical area OA1 and the second optical area OA2, which is referred to as a second resistance, due to the increased wire length.

Referring to FIGS. 5A and 5B, according to a light transmitting structure, since the first optical area OA1 that at least partially overlaps the first optical electronic device 11 includes the first transmitting areas TA1, and the second optical area OA2 that at least partially overlaps with the second optical electronic device 12 includes the second transmission areas TA2, therefore, the first optical area OA1 and the second optical area OA2 can have the number of subpixels per unit area set smaller than the number of subpixels per unit area in the normal area NA.

Accordingly, the number of subpixels connected to each, or one or more, of the first horizontal lines HL1 running through the first optical area OA1 and the second optical area OA2 can be different from the number of subpixels connected to each, or one or more, of the second horizontal lines HL2 disposed only in the normal area NA without running through the first optical area OA1 and the second optical area OA2.

The number of subpixels connected to each, or one or more, of the first horizontal lines HL1 running through the first optical area OA1 and the second optical area OA2, which is referred to as a first number, can be less than the number of subpixels connected to each, or one or more, of the second horizontal lines HL2 disposed only in the normal area NA without running through the first optical area OA1 and the second optical area OA2, which is referred to as a second number.

A difference between the first number and the second number can vary according to a difference between a resolution of each of the first optical area OA1 and the second optical area OA2 and a resolution of the normal area NA. For example, as a difference between a resolution of each of the first optical area OA1 and the second optical area OA2 and a resolution of the normal area NA increases, a difference between the first number and the second number can increase.

As described above, since the number (the first number) of subpixels connected to each, or one or more, of the first horizontal lines HL1 running through the first optical area OA1 and the second optical area OA2 is less than the number of subpixels (second number) connected to each, or one or more, of the second horizontal lines HL2 disposed only in the normal area NA without running through the first optical area OA1 and the second optical area OA2, an area where the first horizontal line HL1 overlaps with one or more other electrodes or lines adjacent to the first horizontal line HL1 can be smaller than an area where the second horizontal line HL2 overlaps one or more other electrodes or lines adjacent to the second horizontal line HL2.

Accordingly, a parasitic capacitance formed between the first horizontal line HL1 and one or more other electrodes or lines adjacent to the first horizontal line HL1, which is referred to as a first capacitance, can be greatly less than a parasitic capacitance formed between the second horizontal line HL2 and one or more other electrodes or lines adjacent to the second horizontal line HL2, which is referred to as a second capacitance.

Considering a relationship in magnitude between the first resistance and the second resistance (the first resistance≥the second resistance) and a relationship in magnitude between the first capacitance and the second capacitance (the first capacitance«second capacitance), a resistance-capacitance (RC) value of the first horizontal line HL1 running through the first optical area OA1 and the second optical area OA2, which is referred to as a first RC value, can be greatly less than an RC value of the second horizontal lines HL2 disposed only in the normal area NA without running through the first optical area OA1 and the second optical area OA2, which is referred to as a second RC value. Thus, in this example, the first RC value is greatly less than the second RC value (e.g., the first RC value«the second RC value).

Due to such a difference between the first RC value of the first horizontal line HL1 and the second RC value of the second horizontal line HL2, which is referred to as an RC load difference, a signal transmission characteristic through the first horizontal line HL1 can be different from a signal transmission characteristic through the second horizontal line HL2.

Figure 6:
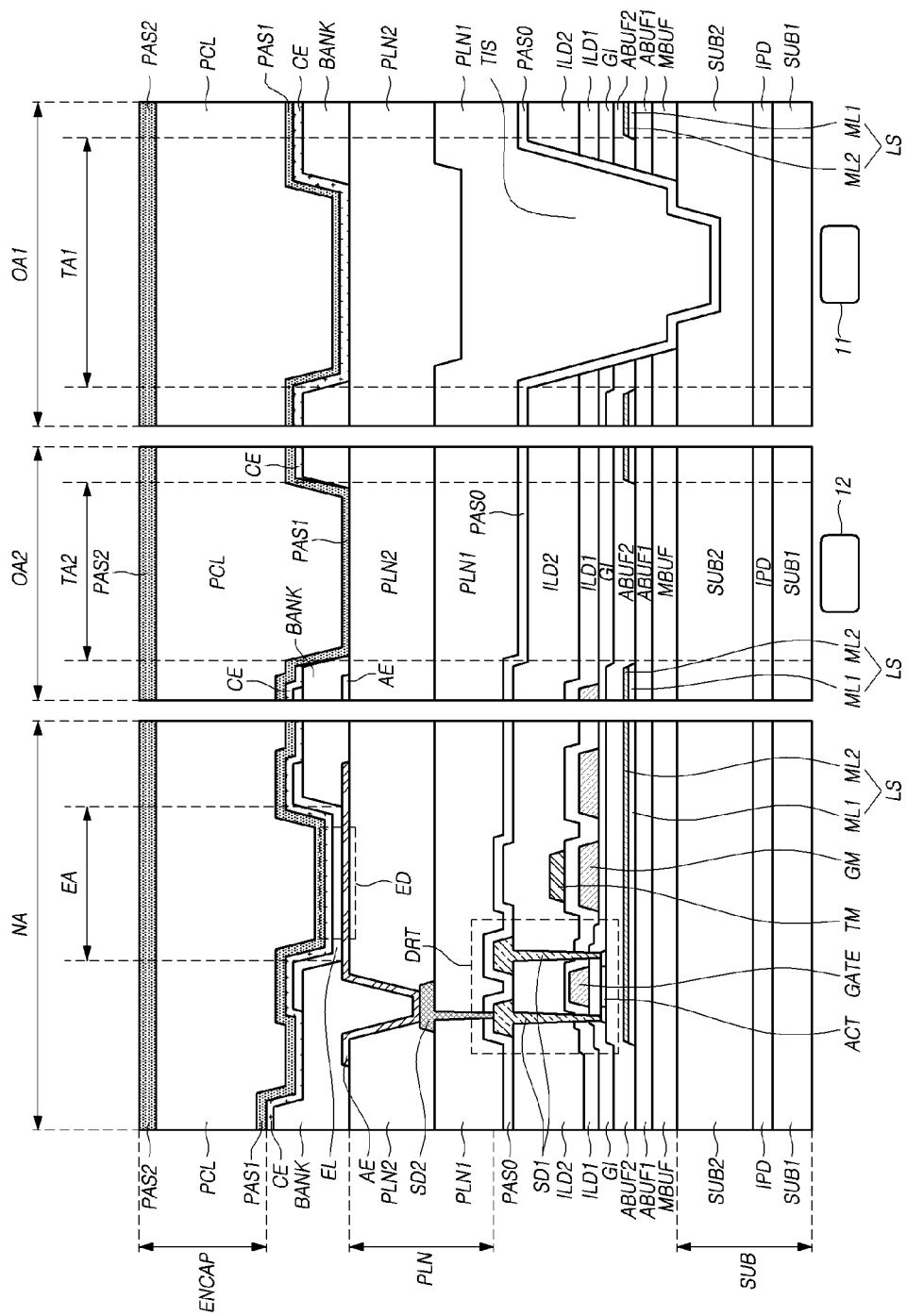
FIGS. 6 and 7 are example cross-sectional views of each of the first optical area, the second optical area, and the normal area included in the display area of the display device according to aspects of the present disclosure.
Figure 7:
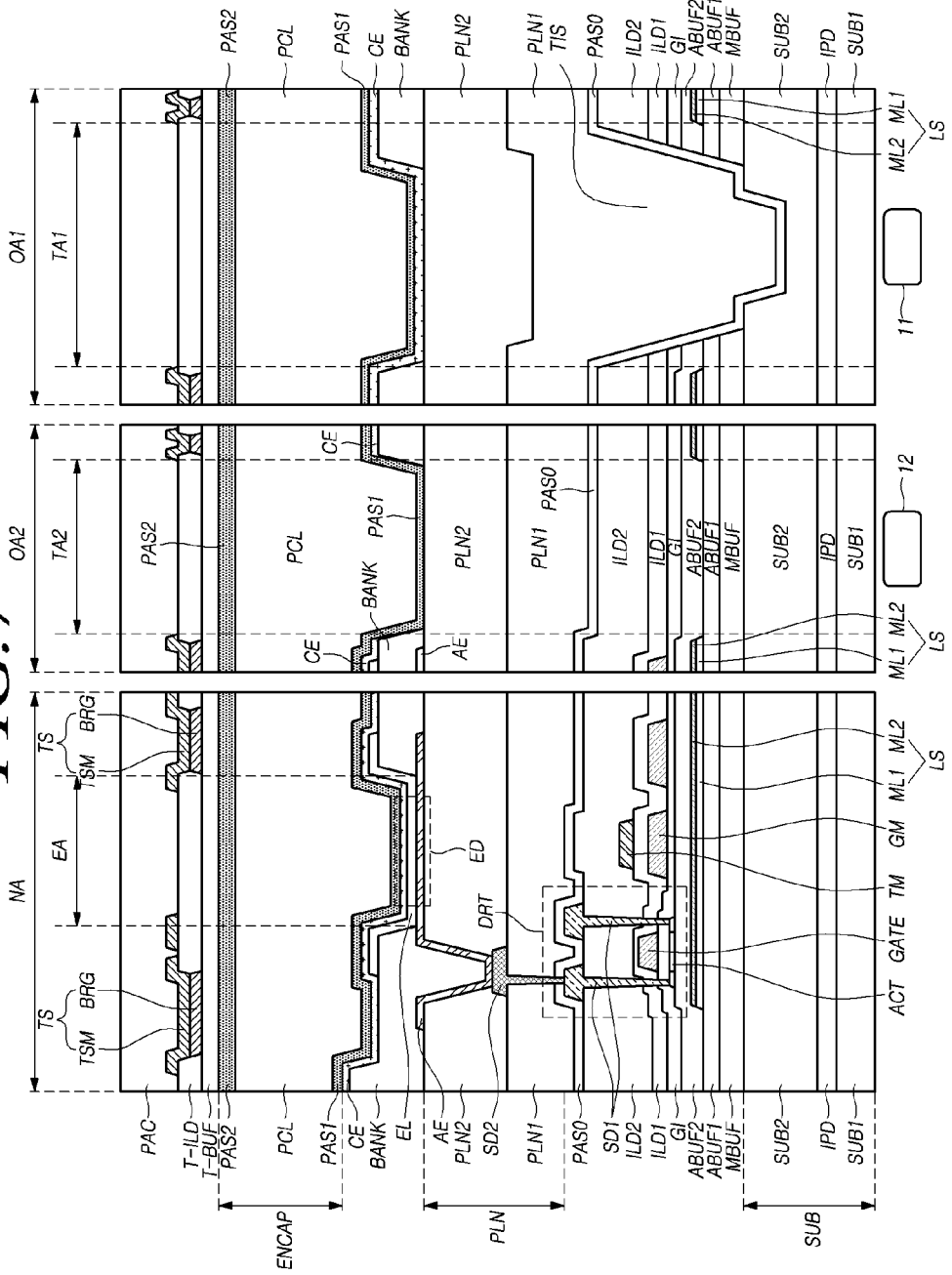

FIGS. 6 and 7 are example cross-sectional views of each of a first optical area (the first optical area OA1 in the figures discussed above), a second optical area (e.g., the second optical area OA2 in the figures discussed above), and a normal area (e.g., the normal area NA in the figures discussed above) included in a display area DA of the display panel PNL according to aspects of the present disclosure.

FIG. 6 illustrates the display panel PNL in an example where a touch sensor is present outside of the display panel PNL in the form of a touch panel. FIG. 7 illustrates the display panel PNL in an example where a touch sensor TS is present inside of the display panel PNL.

Each of FIGS. 6 and 7 shows example cross-sectional views of the normal area NA, the first optical area OA1, and the second optical area OA2 included in the display area DA.

First, a stack structure of the normal area NA will be described with reference to FIGS. 6 and 7. Respective light emitting areas EA of the first optical area OA1 and the second optical area OA2 can have the same stack structure as a light emitting area EA of the normal area NA.

Referring to FIGS. 6 and 7, a substrate SUB can include a first substrate SUB1, an interlayer insulating layer IPD, and a second substrate SUB2. The interlayer insulating layer IPD can be interposed between the first substrate SUB1 and the second substrate SUB2. As the substrate SUB includes the first substrate SUB1, the interlayer insulating layer IPD, and the second substrate SUB2, the substrate SUB can prevent or reduce the penetration of moisture. The first substrate SUB1 and the second substrate SUB2 can be, for example, polyimide (PI) substrates. The first substrate SUB1 can be referred to as a primary PI substrate, and the second substrate SUB2 can be referred to as a secondary PI substrate. But embodiments are not limited thereto. For example, the substrate SUB can be comprised of a single substrate without the interlayer insulating layer IPD.

Referring to FIGS. 6 and 7, various types of patterns ACT, SD1, GATE, for disposing one or more transistors such as a driving transistor DRT, and the like, various types of insulating layers MBUF, ABUF1, ABUF2, GI, ILD1, ILD2, PAS0, and various types of metal patterns TM, GM, ML1, ML2 can be disposed on or over the substrate SUB.

Referring to FIGS. 6 and 7, a multi-buffer layer MBUF can be disposed on the second substrate SUB2, and a first active buffer layer ABUF1 can be disposed on the multi-buffer layer MBUF.

A first metal layer ML1 and a second metal layer ML2 can be disposed on the first active buffer layer ABUF1. The first metal layer ML1 and the second metal layer ML2 can be, for example, light shield layers LS for shielding light.

A second active buffer layer ABUF2 can be disposed on the first metal layer ML1 and the second metal layer ML2. An active layer ACT of the driving transistor DRT can be disposed on the second active buffer layer ABUF2.

A gate insulating layer GI can be disposed to cover the active layer ACT.

A gate electrode GATE of the driving transistor DRT can be disposed on the gate insulating layer GI. Further, a gate material layer GM can be disposed on the gate insulating layer GI, together with the gate electrode GATE of the driving transistor DRT, at a location different from the location where the driving transistor DRT is disposed.

A first interlayer insulating layer ILD1 can be disposed to cover the gate electrode GATE and the gate material layer GM. A metal pattern TM can be disposed on the first interlayer insulating layer ILD1. The metal pattern TM can be located at a location different from the location where the driving transistor DRT is formed. A second interlayer insulating layer ILD2 can be disposed to cover the metal pattern TM on the first interlayer insulating layer ILD1.

Two first source-drain electrode patterns SD1 can be disposed on the second interlayer insulating layer ILD2. One of the two first source-drain electrode patterns SD1 can be a source node of the driving transistor DRT, and the other can be a drain node of the driving transistor DRT.

The two first source-drain electrode patterns SD1 can be electrically connected to first and second side portions of the active layer ACT, respectively, through contact holes formed in the second interlayer insulating layer ILD2, the first interlayer insulating layer ILD1, and the gate insulating layer GI.

A portion of the active layer ACT overlapping the gate electrode GATE can serve as a channel region. One of the two first source-drain electrode patterns SD1 can be connected to the first side portion of the channel region of the active layer ACT, and the other of the two first source-drain electrode patterns SD1 can be connected to the second side portion of the channel region of the active layer ACT.

A passivation layer PAS0 nay be disposed to cover the two first source-drain electrode patterns SD1. A planarization layer PLN can be disposed on the passivation layer PAS0. The planarization layer PLN can include a first planarization layer PLN1 and a second planarization layer PLN2.

The first planarization layer PLN1 can be disposed on the passivation layer PAS0.

A second source-drain electrode pattern SD2 can be disposed on the first planarization layer PLN1. The second source-drain electrode pattern SD2 can be connected to one of the two first source-drain electrode patterns SD1 (corresponding to the second node N2 of the driving transistor DRT in the subpixel SP of FIG. 3) through a contact hole formed in the first planarization layer PLN1.

The second planarization layer PLN2 can be disposed to cover the second source-drain electrode pattern SD2. A light emitting element ED can be disposed on the second planarization layer PLN2.

According to an example stack structure of the light emitting element ED, an anode electrode AE can be disposed on the second planarization layer PLN2. The anode electrode AE can be electrically connected to the second source-drain electrode pattern SD2 through a contact hole formed in the second planarization layer PLN2.

A bank BANK can be disposed to cover a portion of the anode electrode AE. A portion of the bank BANK corresponding to a light emitting area EA of the subpixel SP can be opened.

A portion of the anode electrode AE can be exposed through an opening (the opened portion) of the bank BANK. An emission layer EL can be disposed on side surfaces of the bank BANK and in the opening (the opened portion) of the bank BANK. All or at least a portion of the emission layer EL can be located between adjacent banks.

In the opening of the bank BANK, the emission layer EL can contact the anode electrode AE. A cathode electrode CE can be disposed on the emission layer EL.

The light emitting element ED can be formed by including the anode electrode AE, the emission layer EL, and the cathode electrode CE, as described above. The emission layer EL can include an organic material layer.

An encapsulation layer ENCAP can be disposed on the stack of the light emitting element ED.

The encapsulation layer ENCAP can have a single-layer structure or a multi-layer structure For example, as shown in FIGS. 6 and 7, the encapsulation layer ENCAP can include a first encapsulation layer PAS1, a second encapsulation layer PCL, and a third encapsulation layer PAS2.

The first encapsulation layer PAS1 and the third encapsulation layer PAS2 can be, for example, an inorganic material layer, and the second encapsulation layer PCL can be, for example, an organic material layer. Among the first encapsulation layer PAS1, the second encapsulation layer PCL, and the third encapsulation layer PAS2, the second encapsulation layer PCL can be the thickest and serve as a planarization layer.

The first encapsulation layer PAS1 can be disposed on the cathode electrode CE and can be disposed closest to the light emitting element ED. The first encapsulation layer PAS1 can include an inorganic insulating material capable of being deposited using low-temperature deposition. For example, the first encapsulation layer PAS1 can include, but not limited to, silicon nitride (SiNx), silicon oxide (SiOx), silicon oxynitride (SiON), aluminum oxide (Al2O3), or the like. Since the first encapsulation layer PAS1 can be deposited in a low temperature atmosphere, during the deposition process, the first encapsulation layer PAS1 can prevent the emission layer EL including an organic material vulnerable to a high temperature atmosphere from being damaged.

The second encapsulation layer PCL can have a smaller area or size than the first encapsulation layer PAS1. For example, the second encapsulation layer PCL can be disposed to expose both ends or edges of the first encapsulation layer PAS1. The second encapsulation layer PCL can serve as a buffer for relieving stress between corresponding layers while the display device 100 is curved or bent, and also serve to enhance planarization performance. For example, the second encapsulation layer PCL can include an organic insulating material, such as acrylic resin, epoxy resin, polyimide, polyethylene, silicon oxycarbon (SiOC), or the like. The second encapsulation layer PCL can be disposed, for example, using an inkjet technique.

The third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1. The third encapsulation layer PAS2 can minimize or prevent external moisture or oxygen from penetrating into the first encapsulation layer PAS1 and the second encapsulation layer PCL. For example, the third encapsulation layer PAS2 can include an inorganic insulating material, such as silicon nitride (SiNx), silicon oxide (SiOx), silicon oxynitride (SiON), aluminum oxide (Al2O3), or the like.

Referring to FIG. 7, in an example where a touch sensor TS is embedded into the display panel PNL, the touch sensor TS can be disposed on the encapsulation layer ENCAP. The structure of the touch sensor will be described in detail as follows.

A touch buffer layer T-BUF can be disposed on the encapsulation layer ENCAP. The touch sensor TS can be disposed on the touch buffer layer T-BUF.

The touch sensor TS can include touch sensor metals TSM and at least one bridge metal BRG, which are located in different layers.

A touch interlayer insulating layer T-ILD can be disposed between the touch sensor metals TSM and the bridge metal BRG.

For example, the touch sensor metals TSM can include a first touch sensor metal TSM, a second touch sensor metal TSM, and a third touch sensor metal TSM, which are disposed adjacent to one another. In an embodiment where the third touch sensor metal TSM is disposed between the first touch sensor metal TSM and the second touch sensor metal TSM, and the first touch sensor metal TSM and the second touch sensor metal TSM need to be electrically connected to each other, the first touch sensor metal TSM and the second touch sensor metal TSM can be electrically connected to each other through the bridge metal BRG located in a different layer. The bridge metal BRG can be electrically insulated from the third touch sensor metal TSM by the touch interlayer insulating layer T-ILD.

While the touch sensor TS is disposed on the display panel PNL, a chemical solution (e.g., a developer or etchant) used in the corresponding process or moisture from the outside can be generated or introduced. In some embodiments, by disposing the touch sensor TS on the touch buffer layer T-BUF, a chemical solution or moisture can be prevented from penetrating into the emission layer EL including an organic material during the manufacturing process of the touch sensor TS. Accordingly, the touch buffer layer T-BUF can prevent damage to the emission layer EL, which is vulnerable to a chemical solution or moisture.

In order to prevent damage to the emission layer EL including an organic material, which is vulnerable to high temperatures, the touch buffer layer T-BUF can be formed at a low temperature less than or equal to a predetermined temperature (e.g. 100 degrees (° C.)) and be formed using an organic insulating material having a low permittivity of 1 to 3. For example, the touch buffer layer T-BUF can include an acrylic-based, epoxy-based, or siloxan-based material. As the display device 100 is bent, the encapsulation layer ENCAP can be damaged, and the touch sensor metal located on the touch buffer layer T-BUF can be cracked or broken. Even when the display device 100 is bent, the touch buffer layer T-BUF having the planarization performance as the organic insulating material can prevent the damage of the encapsulation layer ENCAP and/or the cracking or breaking of the metals (TSM, BRG) included in the touch sensor TS.

A protective layer PAC can be disposed to cover the touch sensor TS. The protective layer PAC can be, for example, an organic insulating layer.

Next, a stack structure of the first optical area OA1 will be described with reference to FIGS. 6 and 7 (e.g., a similar discussion focusing on the second optical area OA2 will be discussed later).

Referring to FIGS. 6 and 7, the light emitting area EA of the first optical area OA1 can have the same stack structure as that in the normal area NA. Accordingly, in the discussion that follows, instead of repeatedly describing the light emitting area EA of the first optical area OA1, a stack structure of the first transmission area TA1 of the first optical area OA1 will be described in detail below.

In some embodiments, the cathode electrode CE can be disposed in the light emitting areas EA included in the normal area NA and the first optical area OA1, but may not be disposed in the first transmission area TA1 in the first optical area OA1. For example, the first transmission area TA1 of the first optical area OA1 can correspond to an opening of the cathode electrode CE or a hole in the cathode electrode CE. Also, according to another embodiment, as shown in FIGS. 6 and 7, the cathode electrode CE can be present in the first optical area OA1, but cathode electrode CE can be absent from the second optical area OA2 in order to allow even more light to pass through to the second optical electronic device 12.

Further, in some embodiments, a light shield layer LS including at least one of the first metal layer ML1 and the second metal layer ML2 can be disposed in the light emitting areas EA included in the normal area NA and the first optical area OA1, but may not be disposed in the first transmission area TA1 of the first optical area OA1. For example, the first transmission area TA1 of the first optical area OA1 can correspond to an opening of the light shield layer LS or a hole in the light shield layer LS.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the first optical area OA1 can be disposed in the first transmission area TA1 in the first optical area OA1 equally, substantially equally, or similarly.

However, in some embodiments, all, or one or more, of one or more material layers having electrical properties (e.g., one or more metal material layers, and/or one or more semiconductor layers), except for the insulating materials or layers, disposed in the light emitting areas EA included in the normal area NA and the first optical area OA1 may not be disposed in the first transmission area TA1 in the first optical area OA1 (e.g., these elements can be absent from the first optical area OA1 in order to allow more light to pass through to first optical electronic device 11).

For example, referring to FIGS. 6 and 7, all, or one or more, of the metal material layers (ML1, ML2, GATE, GM, TM, SD1, SD2) related to at least one transistor and the active layer ACT may not be disposed in the first transmission area TA1.

Referring to FIGS. 6 and 7, in some embodiments, the anode electrode AE and the cathode electrode CE included in the light emitting element ED may not be disposed in the first transmission area TA1, in order to improve the transmittance of light passing to first optical electronic device 11. In some embodiments, the emission layer EL of the light emitting element ED may or may not be disposed in the first transmission area TA1 according to a design requirement.

Further, referring to FIG. 7, in some embodiments, the touch sensor metal TSM and the bridge metal BRG included in the touch sensor TS may not be disposed in the first transmission area TA1 in the first optical area OA1.

Accordingly, the light transmittance of the first transmission area TA1 in the first optical area OA1 can be provided or improved because the material layers (e.g., one or more metal material layers, and/or one or more semiconductor layers) having electrical properties are not disposed in the first transmission area TA1 in the first optical area OA1. As a consequence, the first optical electronic device 11 can perform a predefined function (e.g., image sensing) by receiving light that passes through the first transmission area TA1.

In some embodiments, since all, or one or more, of the first transmission area TA1 in the first optical area OA1 overlap with the first optical electronic device 11, to enable the first optical electronic device 11 to operate normally and receive plenty of light through the display panel PNL, it is desired to further increase a transmittance of the first transmission area TA1 in the first optical area OA1.

To achieve the foregoing, in the display panel PNL of the display device 100 according to aspects of the present disclosure, a transmittance improvement structure TIS can be provided to the first transmission area TA1 of the first optical area OA1. For example, the transmittance improvement structure TIS can have a type of funnel shape to help direct light towards the first optical electronic device 11.

Referring to FIGS. 6 and 7, the plurality of insulating layers included in the display panel PNL can include at least one buffer layer (MBUF, ABUF1, and/or ABUF2) between at least one substrate (SUB1 and/or SUB2) and at least one transistor (DRT and/or SCT), at least one planarization layers (PLN1 and/or PLN2) between the transistor DRT and the light emitting element ED, at least one encapsulation layer ENCAP on the light emitting element ED, and the like.

Referring to FIG. 7, the plurality of insulating layers included in the display panel PNL can further include the touch buffer layer T-BUF and the touch interlayer insulating layer T-ILD located on the encapsulation layer ENCAP, and the like.

Referring to FIGS. 6 and 7, the first transmission area TA1 in the first optical area OA1 can have a structure in which the first planarization layer PLN1 and the passivation layer PAS0 have depressed portions that extend downward from respective surfaces thereof as a transmittance improvement structure TIS.

Referring to FIGS. 6 and 7, among the plurality of insulating layers, the first planarization layer PLN1 can include at least one lower protruding portion that can fill or extend into at least one depression (e.g., a recess, a trench, a concave portion, a protrusion, or the like). The first planarization layer PLN1 can be, for example, an organic insulating layer.

In the example where the first planarization layer PLN1 has the depressed portion that extends downward from the surfaces thereof, the second planarization layer PLN2 can substantially serve to provide planarization. In one embodiment, the second planarization layer PLN2 can also have a depressed portion that extends downward from the surface thereof. In this embodiment, the second encapsulation layer PCL can substantially serve to provide planarization.

Referring to FIGS. 6 and 7, the depressed portions of the first planarization layer PLN1 and the passivation layer PAS0 can pass through holes in various insulating layers, such as the first interlayer insulating layer ILD1, the second interlayer insulating layer ILD2, the gate insulating layer GI, and the like, for forming the transistor DRT, and buffer layers, such as the first active buffer layer ABUF1, the second active buffer layer ABUF2, the multi-buffer layer MBUF, and the like, located under the insulating layers, and extend up to an upper portion of the second substrate SUB2. In this way, the depressed portions of the first planarization layer PLN1 and the passivation layer PAS0 can form a type of funnel for the transmittance improvement structure TIS to help pass light towards the first optical electronic device 11, in which the first planarization layer PLN1 and the passivation layer PAS0 can be formed of one or more transparent materials.

Referring to FIGS. 6 and 7, the substrate SUB can include at least one concave portion or depressed portion as a transmittance improvement structure TIS. For example, in the first transmission area TA1, an upper portion of the second substrate SUB2 can be indented or depressed downward, or the second substrate SUB2 can be perforated.

Referring to FIGS. 6 and 7, the first encapsulation layer PAS1 and the second encapsulation layer PCL included in the encapsulation layer ENCAP can also have a transmittance improvement structure TIS in which the first encapsulation layer PAS1 and the second encapsulation layer PCL have depressed portions that extend downward from the respective surfaces thereof. The second encapsulation layer PCL can be, for example, an organic insulating layer.

Referring to FIG. 7, to protect the touch sensor TS, the protective layer PAC can be disposed to cover the touch sensor TS on the encapsulation layer ENCAP.

Referring to FIG. 7, the protective layer PAC can have at least one depression (e.g., a recess, a trench, a concave portion, a protrusion, or the like) as a transmittance improvement structure TIS in a portion overlapping the first transmission area TA1. The protective layer PAC can be, for example, an organic insulating layer.

Referring to FIG. 7, the touch sensor TS can include one or more touch sensor metals TSM with a mesh type. In the example where the touch sensor metal TSM is formed in the mesh type, a plurality of openings can be formed in the touch sensor metal TSM. Each of the plurality of openings can be located to correspond to the light emitting area EA of the subpixel SP.

In order for the first optical area OA1 to have a transmittance greater than the normal area NA, an area or size of the touch sensor metal TSM per unit area in the first optical area OA1 can be smaller than an area or size of the touch sensor metal TSM per unit area in the normal area NA.

Referring to FIG. 7, in some embodiments, the touch sensor TS can be disposed in the light emitting area EA in the first optical area OA1, but may not be disposed in the first transmission area TA1 in the first optical area OA1.

Next, a stack structure of the second optical area OA2 will be described with reference to FIGS. 6 and 7. For example, similar to how the discussion above focused on the first optical area OA1, the following discussion will now focus on the second optical area OA2.

Referring to FIGS. 6 and 7, the light emitting area EA of the second optical area OA2 can have the same stack structure as that of the normal area NA. Accordingly, in the discussion that follows, instead of repeatedly describing the light emitting area EA in the second optical area OA2, a stack structure of the second transmission area TA2 in the second optical area OA2 will be described in detail below.

In some embodiments, the cathode electrode CE can be disposed in the light emitting areas EA included in the normal area NA and the second optical area OA2, but may not be disposed in the second transmission area TA2 in the second optical area OA2. For example, the second transmission area TA2 in the second optical area OA2 can be corresponded to an opening of the cathode electrode CE or a hole in the cathode electrode CE, in order to help allow light to pass through to the second optical electronic device 12.

In an embodiment, the light shield layer LS including at least one of the first metal layer ML1 and the second metal layer ML2 can be disposed in the light emitting areas EA included in the normal area NA and the second optical area OA2, but may not be disposed in the second transmission area TA2 in the second optical area OA2. For example, the second transmission area TA2 in the second optical area OA2 can be corresponded to an opening of the light shield layer LS or a hole in the light shield layer LS, in order to help allow light to pass through to the second optical electronic device 12.

In an example where the transmittance of the second optical area OA2 and the transmittance of the first optical area OA1 are the same, the stack structure of the second transmission area TA2 in the second optical area OA2 can be the same as the stacked structure of the first transmission area TA1 in the first optical area OA1.

In another example where the transmittance of the second optical area OA2 and the transmittance of the first optical area OA1 are different, the stack structure of the second transmission area TA2 in the second optical area OA2 can be different at least in part from as the stacked structure of the first transmission area TA1 in the first optical area OA1.

For example, as shown in FIGS. 6 and 7, in some embodiments, when the transmittance of the second optical area OA2 is lower than the transmittance of the first optical area OA1, the second transmission area TA2 in the second optical area OA2 may not have a transmittance improvement structure TIS. As a result, the first planarization layer PLN1 and the passivation layer PAS0 may not be indented or depressed (e.g., no funnel shape structure over the second optical electronic device 12). In an embodiment, a width of the second transmission area TA2 in the second optical area OA2 can be smaller than a width of the first transmission area TA1 in the first optical area OA1.

The substrate SUB, and the various types of insulating layers (MBUF, ABUF1, ABUF2, GI, ILD1, ILD2, PAS0, PLN (PLN1, PLN2), BANK, ENCAP (PAS1, PCL, PAS2), T-BUF, T-ILD, PAC) disposed in the light emitting areas EA included in the normal area NA and the second optical area OA2 can be disposed in the second transmission area TA2 of the second optical area OA2 equally, substantially equally, or similarly.

However, in some embodiments, all, or one or more, of one or more material layers having electrical properties (e.g., one or more metal material layers, and/or optical area semiconductor layers), except for the insulating materials or layers, disposed in the light emitting areas EA included in the normal area NA and the second optical area OA2 may not be disposed in the second transmission area TA2 in the second optical area OA2.

For example, referring to FIGS. 6 and 7, all, or one or more, of the metal material layers (ML1, ML2, GATE, GM, TM, SD1, SD2) related to at least one transistor and the active layer ACT may not be disposed in the second transmission area TA2 in the second optical area OA2.

Further, referring to FIGS. 6 and 7, in some embodiments, the anode electrode AE and the cathode electrode CE included in the light emitting element ED may not be disposed in the second transmission area TA2. In some embodiments, the emission layer EL of the light emitting element ED may or may not be disposed in the second transmission area TA2 of the second optical area OA2.

Further, referring to FIG. 7, in some embodiments, the touch sensor metal TSM and the bridge metal BRG included in the touch sensor TS may not be disposed in the second transmission area TA2 in the second optical area OA2.

Accordingly, the light transmittance of the second transmission area TA2 in the second optical area OA2 can be provided or improved because the various material layers (e.g., one or more metal material layers, and/or one or more semiconductor layers) having electrical properties are not disposed in the second transmission area TA2 in the second optical area OA2. As a consequence, the second optical electronic device 12 can perform a predefined function (e.g., detecting an object or human body, or an external illumination detection) by receiving light transmitting through the second transmission area TA2.

Figure 8:
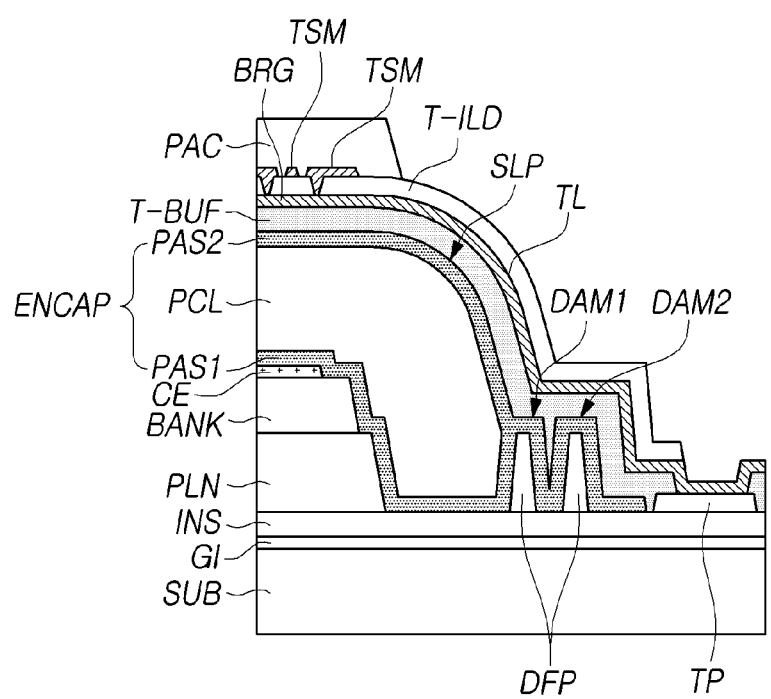
FIG. 8 is an example cross-sectional view of an edge of a display panel according to aspects of the present disclosure.

FIG. 8 is an example cross-sectional view of an edge of the display panel PNL according to aspects of the present disclosure.

For the sake of brevity, in FIG. 8, a single substrate SUB including the first substrate SUB1 and the second substrate SUB2 is illustrated, and layers or portions located under the bank BANK are illustrated in a simplified structure. In the same manner, FIG. 8 illustrates a single planarization layer PLN including the first planarization layer PLN1 and the second planarization layer PLN2, and a single interlayer insulating layer INS including the second interlayer insulating layer ILD2 and the first interlayer insulating layer ILD1 located under the planarization layer PLN.

Referring to FIG. 8, the first encapsulation layer PAS1 can be disposed on the cathode electrode CE and disposed closest to the light emitting element ED. The second encapsulation layer PCL can have a smaller area or size than the first encapsulation layer PAS1. For example, the second encapsulation layer PCL can be disposed to expose both ends or edges of the first encapsulation layer PAS1.

The third encapsulation layer PAS2 can be disposed over the substrate SUB over which the second encapsulation layer PCL is disposed such that the third encapsulation layer PAS2 covers the respective top surfaces and side surfaces of the second encapsulation layer PCL and the first encapsulation layer PAS1.

The third encapsulation layer PAS2 can minimize or prevent external moisture or oxygen from penetrating into the first encapsulation layer PAS1 and the second encapsulation layer PCL.

Referring to FIG. 8, in order to prevent the encapsulation layer ENCAP from collapsing, the display panel PNL can include one or more dams (DAM1 and/or DAM2) at, or near to, an end or edge of an inclined surface SLP of the encapsulation layer ENCAP. The one or more dams (DAM1 and/or DAM2) can be present at, or near to, a boundary point between the display area DA and the non-display area NDA.

The one or more dams (DAM1 and/or DAM2) can include the same material DFP as the bank BANK.

Referring to FIG. 8, in one embodiment, the second encapsulation layer PCL including an organic material can be located only on an inner side of a first dam DAM1, which is located closest to the inclined surface SLP of the encapsulation layer ENCAP among the dams. For example, the second encapsulation layer PCL may not be located on all of the dams (DAM1 and DAM2). In another embodiment, the second encapsulation layer PCL including an organic material can be located on at least the first dam DAM1 of the first dam DAM1 and a second dam DAM2.

For example, the second encapsulation layer PCL can extend only up to all, or at least a portion, of an upper portion of the first dam DAM1. In further another embodiment, the second encapsulation layer PCL can extend past the upper portion of the first dam DAM1 and extend up to all, or at least a portion of, an upper portion of the secondary dam DAM2.

Referring to FIG. 8, a touch pad TP, to which the touch driving circuit TDC, as shown in FIG. 2, is electrically connected, can be disposed on a portion of the substrate SUB outside of the one or more dams (DAM1 and/or DAM2).

A touch line TL can electrically connect, to the touch pad TP, the touch sensor metal TSM or the bridge metal BRG included in, or serving as, a touch electrode disposed in the display area DA.

One end or edge of the touch line TL can be electrically connected to the touch sensor metal TSM or the bridge metal BRG, and the other end or edge of the touch line TL can be electrically connected to the touch pad TP.

The touch line TL can run downward along the inclined surface SLP of the encapsulation layer ENCAP, run along the respective upper portions of the one or more dams (DAM1 and/or DAM2), and extend up to the touch pad TP disposed outside of the one or more dams (DAM1 and/or DAM2).

Referring to FIG. 8, in one embodiment, the touch line TL can be the bridge metal BRG. In another embodiment, the touch line TL can be the touch sensor metal TSM. But embodiments are not limited thereto. For example, the touch line TL can be both of the bridge metal BRG and the touch sensor metal TSM.

Figure 9:
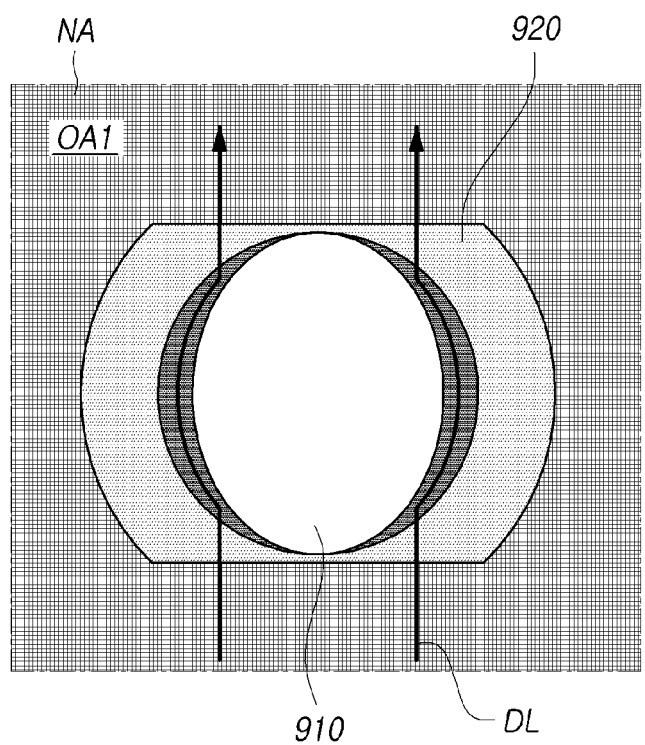
FIG. 9 is a plan view of an example portion of the display device according to aspects of the present disclosure.

FIG. 9 is a plan view of an example portion of the display device according to aspects of the present disclosure.

Referring to FIG. 9, the display device can include a first optical area (e.g., the first optical area OA1 in the figures discussed above) and a normal area (e.g., the normal area NA in the figures discussed above) located outside of the first optical area OA1.

The first optical area OA1 can include a central area 910 and a bezel area 920.

In order to increase the transmittance of the central area 910, a specific metal layer or a circuit element may not be located in the central area 910. The bezel area 920 can include one or more transistors, and the central area 910 may not include a transistor. A transistor for driving one or more light emitting elements located in the central area 910 may not be located in the central area 910. Transistors for driving one or more light emitting elements located in the central area 910 can be located in the bezel area 920. In other words, various circuit elements for driving the subpixels located within the central area 910 can be moved outside of the central area 910 and positioned nearby in the bezel area 920.

In order to increase the transmittance of the central area 910, one or more data lines DL can be disposed in the bezel area 920 while bypassing the central area 910 (e.g., some data lines DL can curve around the central area 910).

In an example where transistors for driving light emitting elements located in the central area 910 are disposed in the bezel area 920 in order to increase the transmittance of the central area 910, the transistors located in the bezel area 920 still need to be electrically connected to the light emitting elements located in the central area 910. The first optical area can include a plurality of horizontal lines to connect between the light emitting elements located in the central area 910 and the transistors located in the bezel area 920.

Figure 10:
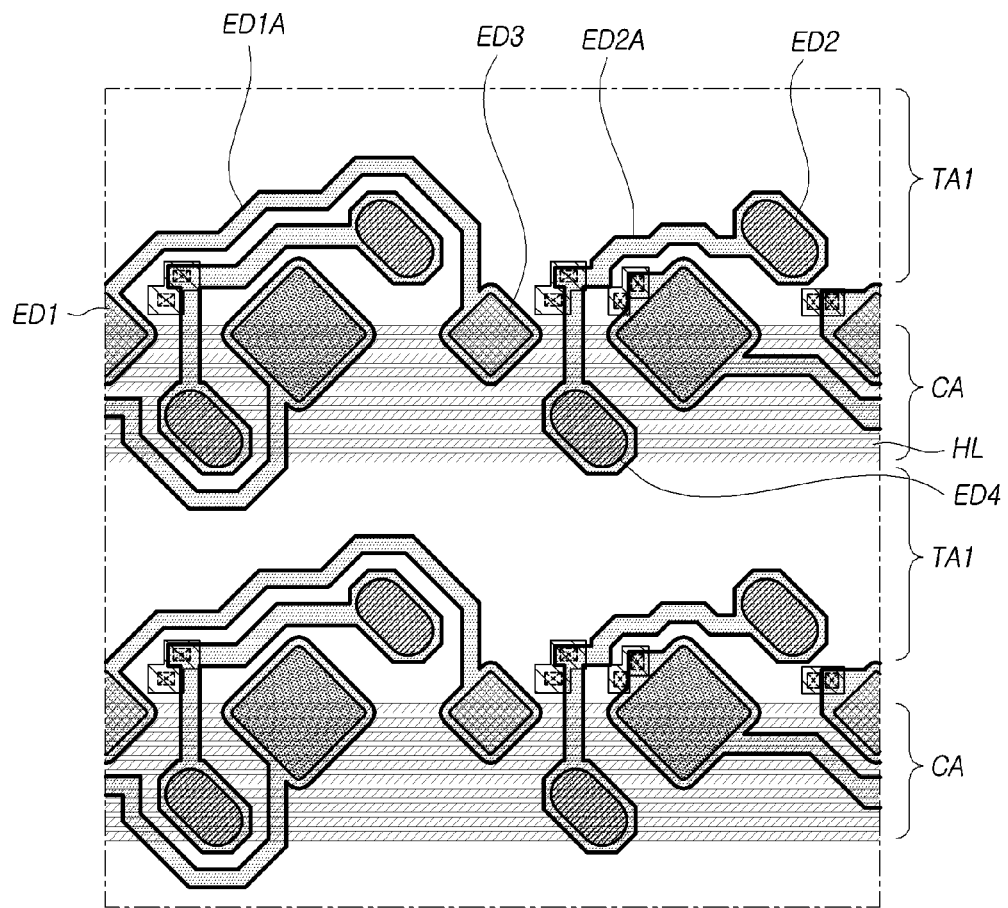
FIG. 10 is a plan view of a first optical area of a display device according to a comparative example according to aspects of the present disclosure.

FIG. 10 is a plan view of a first optical area of a display device according to a comparative example of an embodiment.

Referring to FIG. 10, the display device according to the comparative example can include a first light emitting element ED1, a second light emitting element ED2, a third light emitting element ED3, and a fourth light emitting element ED4 located in a first optical area. A plurality of horizontal lines HL can be disposed in the first optical area. The plurality of horizontal lines HL can be lines for connecting the light emitting elements to their corresponding transistors located in the bezel area.

The anode electrodes of the first light emitting element ED1 and the third light emitting element ED3 can be electrically connected to one transistor through a first anode electrode line ED1A.

The anode electrodes of the second light emitting element ED2 and the fourth light emitting element ED4 can be electrically connected to another transistor through a second anode electrode line ED2A.

In the display device according to the comparative example, since the anode electrode lines ED1A and ED2A are formed with the same material layer as the anode electrodes AE, in order to prevent a short circuit between the anode electrode lines ED1A and ED2A, the entire portion of each of the anode electrode lines ED and ED2A may not always be disposed in a circuit area CA, and thus, a considerable portion of each of the anode electrode lines ED1A and ED2A may be need to bypass into a first transmission area TA1. Accordingly, the transmittance of the first optical area can be lowered due to the anode electrode lines ED1A and ED2A (e.g., which have to go all the way around other light emitting elements and protrude into the first transmission area TA1), and thereby, the amount of light reaching an optical electronic device disposed in the first optical area may be reduced.

Figure 11:
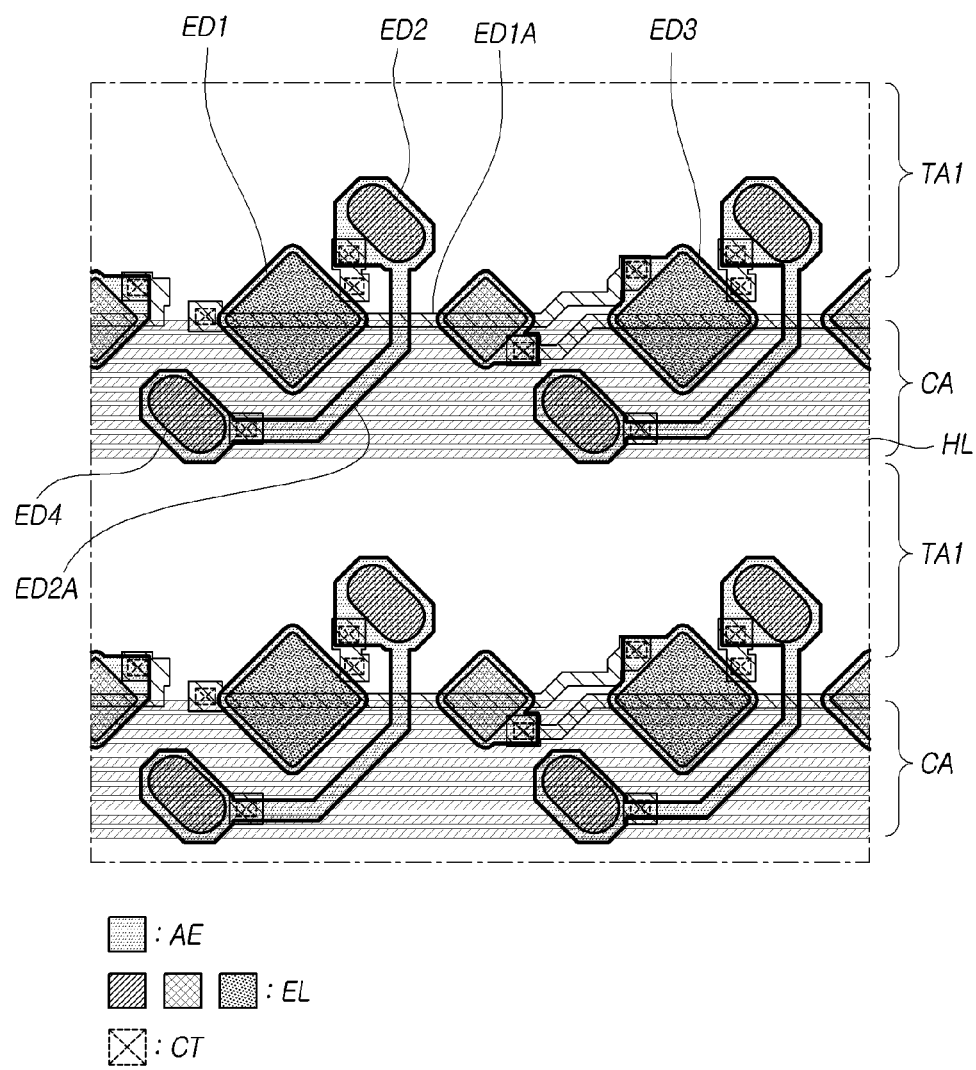
FIGS. 11 and 12 are example plan views of the first optical area of the display device according to aspects of the present disclosure.

FIG. 11 is an example plan view of the first optical area OA1 of the display device according to aspects of the present disclosure.

Referring to FIG. 11, the display device according to aspects of the present disclosure can include a plurality of horizontal lines HL located in the first optical area, and a first light emitting element ED1, a second light emitting element ED2, a third light emitting element ED3, and a fourth light emitting element ED4 located in the first optical area. Also, the plurality of horizontal lines HL can be formed for a transparent material or a semi-transparent material.

The plurality of horizontal lines HL can be gate lines GL. The plurality of horizontal lines HL can be lines for electrically connecting transistors located in a bezel area of the first optical area to light emitting elements located in a central area of the first optical area.

The first optical area can include a first transmission area TA1 and a circuit area CA. The circuit area CA can be an area in which pixel circuit elements for driving light emitting elements are located or lines for electrically connecting the pixel circuit elements and the light emitting elements are located. The circuit area CA can be an area in which transistors or a plurality of horizontal lines are disposed. For example, transistors and a plurality of horizontal lines can be disposed in the circuit area CA in the bezel area, and the plurality of horizontal lines can be disposed in the circuit area CA in the central area.

The first transmission area TA1 can refer to an area in which a transistor and a horizontal line are not substantially disposed. Since the transistor and the horizontal line are not disposed in the first transmission area TA1, the first transmission area TA1 can have a high transmittance.

The circuit area CA and the first transmission area TA1 can be alternately and repeatedly located. For example, the circuit area CA and the first transmission area TA1 can be arranged as alternating rows. In the example where the circuit area CA and the first transmission area TA1 are alternately and repeatedly located, the first optical area can have a high transmittance as a whole.

A first anode electrode line ED1A of the first light emitting element ED1 can jump over or cross over a second anode electrode line ED2A of the second light emitting element ED2 in an area in which the plurality of horizontal lines are located. For example, the first anode electrode line ED1A of the first light emitting element ED1 can jump over or cross over the second anode electrode line ED2A of the second light emitting element ED2 in the circuit area CA.

The jumping of the first anode electrode line ED1A over or under the second anode electrode line ED2A can mean that the display device has a structure in which a portion where the first anode electrode line ED1A and the second anode electrode line ED2A overlap each other is present, and the first anode electrode line ED1A and the second anode electrode line ED2A are formed with different material layers from each other in the overlapped portion of the first anode electrode line ED and the second anode electrode line ED2A. For example, the second anode electrode line ED2A can be formed with an anode electrode material layer, and the first anode electrode line ED1A can be formed with a source-drain electrode material layer of a transistor. But embodiments are not limited thereto. For example, the second anode electrode line ED2A or the first anode electrode line ED1A can be formed with another metal layer such as the light shield layers LS and the gate electrode material layer of a transistor. Thereby, the first anode electrode line ED1A and the second anode electrode line ED2A can at least partially overlap each other, with at least one insulating later or insulation portion disposed therebetween.

The first optical area can include the third light emitting element ED3. The third light emitting element ED3 can include an anode electrode electrically connected to the anode electrode of the first light emitting element ED1.

Both the first light emitting element ED1 and the third light emitting element ED3 can be electrically connected to a single driving transistor. In the example where the first light emitting element ED1 and the third light emitting element ED3 are electrically connected to one transistor, and driven by the one transistor, transistors disposed in a space-limited bezel area can drive a greater number of light emitting elements. But embodiments are not limited thereto, and more than two light emitting elements can be electrically connected to a single driving transistor. And transistors disposed in a space-limited bezel area can drive various numbers of light emitting elements.

The first anode electrode line ED1A can refer to a line that electrically connects the anode electrode of the first light emitting element ED1 to the anode electrode of the third light emitting element ED3 and is located in the first optical area OA1. The first anode electrode line ED1A can be formed with or include a material layer different from the anode electrode AE. For example, the first anode electrode line ED1A can be formed with or include a source-drain electrode material layer. The source-drain electrode material layer can refer to a material layer used for electrically connecting the source-drain electrode of a transistor to which the first light emitting element ED1 and the third light emitting element ED3 are connected to the first light emitting element ED1 or the second light emitting element ED2.

The first optical area can include the fourth light emitting element ED4. The fourth light emitting element ED4 can include an anode electrode electrically connected to the anode electrode of the second light emitting element ED2.

Both the second light emitting element ED2 and the fourth light emitting element ED4 can be electrically connected to a single driving transistor. In the example where the second light emitting element ED2 and the fourth light emitting element ED4 are electrically connected to one transistor, and driven by the one transistor, transistors disposed in a space-limited bezel area can drive a greater number of light emitting elements.

The second anode electrode line ED2A can refer to a line that electrically connects the anode electrode of the second light emitting element ED2 to the anode electrode of the fourth light emitting element ED4 and is located in the first optical area. The second anode electrode line ED2A can be formed with the same material layer as the anode electrode AE of the second light emitting element ED2. The second anode electrode line ED2A can be formed with the same material layer as the anode electrode AE of the fourth light emitting element ED4. Since the second anode electrode line ED2A is formed with the same material layer as the anode electrode AE, in order for the first anode electrode line ED1A to jump over or cross over the second anode electrode line ED2A and to be located in the circuit area CA, the first anode electrode line ED1A is desired to be formed with or include a material layer different from the anode electrode AE.

In an example where the first anode electrode line ED1A of the first light emitting element jumps over the second anode electrode line ED2A of the second light emitting element, the anode electrode lines ED1A and ED2A can be disposed to overlap each other in the circuit area CA, and therefore, a degree to which the anode electrode lines ED and ED2A bypass the first transmission area TA1 can be reduced, this leading the first optical area to have a higher transmittance.

The first optical area can include a plurality of contact holes CT and at least some of the plurality of contact holes CT can be disposed to not overlap with any of a plurality of horizontal lines HL. Also, some of the plurality of contact holes CT can be disposed to overlap with one or more of the plurality of horizontal lines HL. The plurality of contact holes CT can include one or more contact holes through which the first anode electrode line ED1A of one or more light emitting elements (ED1 and/or ED3) is connected to the anode electrodes AE of the one or more light emitting elements (ED1 and/or ED3).

Figure 12:
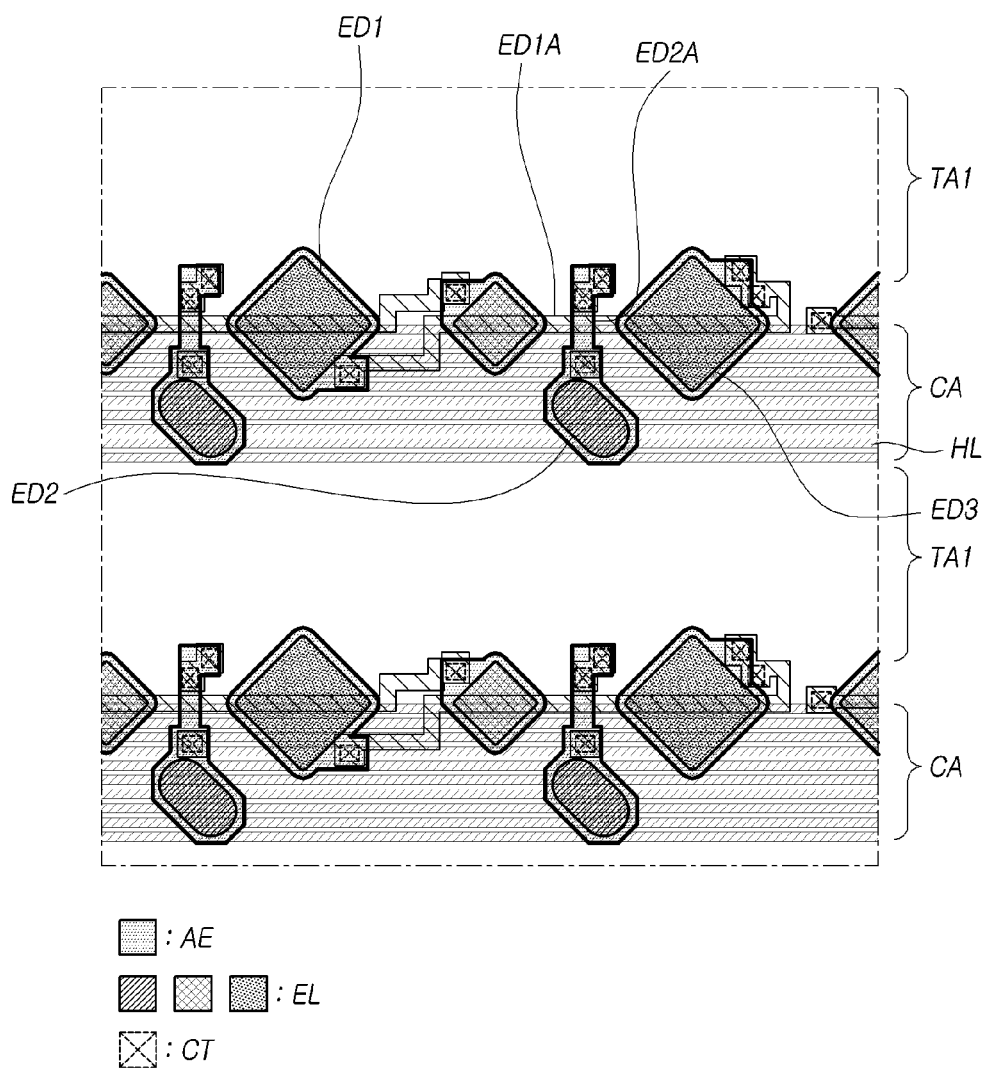

FIG. 12 is an example plan view of the first optical area OA1 of the display device according to aspects of the present disclosure.

Referring to FIG. 12, a first anode electrode line ED1A of a first light emitting element ED1 can jump over or cross over a second anode electrode line ED2A of a second light emitting element ED2 in an area in which a plurality of horizontal lines are located. For example, the first anode electrode line ED1A of the first light emitting element ED1 can jump the second anode electrode line ED2A of the second light emitting element ED2 in a circuit area CA. In this way, more of the wiring and circuitry can be concentrated in the circuit area CA to allow more space for the first transmission area TA1 (e.g., the first transmission area TA1 can be enlarged, thus allowing more light to pass through).

In an example where the first anode electrode line ED1A of the first light emitting element jumps over the second anode electrode line ED2A of the second light emitting element, the anode electrode lines ED1A and ED2A can be disposed to overlap each other in the circuit area CA, and therefore, a degree to which the anode electrode lines ED and ED2A bypass a first transmission area TA1 can be reduced, this leading the first optical area to have a higher transmittance.

Unlike the example shown in FIG. 11, the example shown in FIG. 12 may not include a fourth light emitting element including an anode electrode electrically connected to the anode electrode of the second light emitting element ED2. Referring to FIG. 11, only three types of light emitting elements are used and there is not the light emitting element fully located in the first transmission area TA1 (e.g., in contrast to FIG. 11 where the fourth light emitting element ED4 is fully located in first transmission area TA1 which reduces light transmittance). The example shown in FIG. 12 does not include a fourth light emitting element located in the first transmission area TA1, and thereby, the first transmission area TA1 can have a higher transmittance.

The embodiments described above will be briefly described as follows.

According to the embodiments described above, a display device (e.g., the display device 100 discussed above) can be provided that includes a display area DA, a plurality of horizontal lines HL, and first and second light emitting elements ED1 and ED2.

The display area DA can include a first optical area OA1 and a normal area NA located outside of the first optical area OA1.

The first optical area OA1 can include a central area 910 and a bezel area 920 located outside of the central area 910.

The plurality of horizontal lines HL can be located in the first optical area OA1. The first light emitting element ED1 can be located in the first optical area OA1. The second light emitting element ED2 can be located in the first optical area OA1.

A first anode electrode line ED1A of the first light emitting element ED1 can jump a second anode electrode line ED2A of the second light emitting element ED2 in an area in which the plurality of horizontal lines HL are located.

The plurality of horizontal lines HL can include gate lines GL.

The first optical area OA1 can include a circuit area CA and a first transmission area TA1. One or more transistors or one or more horizontal lines can be disposed in the circuit area CA. A transistor and a horizontal line may not be substantially disposed in the first transmission area TA1. The circuit area CA and the first transmission area TA1 can be alternately and repeatedly located.

The bezel area 920 can include one or more transistors, and the central area 910 may not include a transistor.

The first optical area OA1 can include a plurality of contact holes CT located without overlapping the plurality of horizontal lines HL.

The second anode electrode line ED2A can be formed with the same material layer as the anode electrode of the second light emitting element ED2.

The first anode electrode line ED1A of the first light emitting element ED1 can be formed with or include a source-drain electrode material layer.

The display device 100 can include a third light emitting element ED3. The third light emitting element ED3 can include an anode electrode that is located in the first optical area OA1 and electrically connected to the anode electrode of the first light emitting element ED1.

Both the first light emitting element ED1 and the third light emitting element ED3 can be electrically connected to a single driving transistor.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein can be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A display device comprising:
   a display area comprising a first optical area and a normal area located outside of the first optical area, the first optical area including a central area and a bezel area located outside of the central area;
   a plurality of wiring lines located in the first optical area;
   a first light emitting element located in the first optical area; and
   a second light emitting element located in the first optical area,
   wherein a first anode electrode line of the first light emitting element jumps over a second anode electrode line of the second light emitting element in an area in which the plurality of wiring lines are located.

2. The display device according to claim 1, wherein the first optical area is disposed over or overlaps with at least one optical electronic device including one of more of a camera, a proximity sensor, an illuminance sensor and an infrared sensor.

3. The display device according to claim 1, wherein the plurality of wiring lines are horizontal lines with respect to a front view of the display device.

4. The display device according to claim 1, wherein the plurality of wiring lines comprise one or more gate lines.

5. The display device according to claim 1, wherein the first optical area includes:
   a circuit area and a transistor or at least one of the plurality of wiring lines is disposed in the circuit area; and
   a first transmission area that does not overlap with any transistor or any wiring line for allowing light to pass through the first transmission area.

6. The display device according to claim 5, wherein the circuit area and the first transmission area are alternately and repeatedly arranged.

7. The display device according to claim 1, wherein the bezel area includes one or more transistors, and
   wherein the central area does not include a transistor.

8. The display device according to claim 7, wherein the one or more transistors are configured to drive at least one of the first light emitting element and the second light emitting element.

9. The display device according to claim 7, wherein the one or more transistors are electrically connected to at least one of the first light emitting element and the second light emitting element through at least one of the plurality of wiring lines.

10. The display device according to claim 1, wherein a plurality of contact holes located in the first optical area without overlapping with the plurality of wiring lines.

11. The display device according to claim 10, wherein the first anode electrode line is connected to an anode electrode of the first light emitting element via one or more of the plurality of contact holes, and
    wherein the second anode electrode line is connected to an anode electrode of the second light emitting element via one or more of the plurality of contact holes.

12. The display device according to claim 1, wherein the second anode electrode line and an anode electrode of the second light emitting element are a same material layer.

13. The display device according to claim 1, wherein the first anode electrode line of the first light emitting element is formed with or comprises a source-drain electrode material layer of a transistor connected to the first light emitting element.

14. The display device according to claim 1, further comprising:
    a third light emitting element located in the first optical area, the third light emitting element including an anode electrode electrically connected to an anode electrode of the first light emitting element.

15. The display device according to claim 14, wherein the first light emitting element and the third light emitting element are electrically connected to a same driving transistor.

16. The display device according to claim 14, wherein the anode electrode of the third light emitting element is electrically connected to the anode electrode of the first light emitting element through the first anode electrode line.

17. The display device according to claim 14, further comprising:
    a fourth light emitting element located in the first optical area, the fourth light emitting element including an anode electrode electrically connected to an anode electrode of the second light emitting element.

18. The display device according to claim 17, wherein the second light emitting element and the fourth light emitting element are electrically connected to a same driving transistor.

19. A display device comprising:
- a display area including a first optical area and a normal area located outside of the first optical area, the first optical area having a higher transparency than the normal area;
- a plurality of wiring lines located in the first optical area;
- a first light emitting element located in the first optical area; and
- a second light emitting element located in the first optical area,
- wherein a first electrode line of the first light emitting element crosses over a second electrode line of the second light emitting element.

20. The display device according to claim 19, further comprising:
- at least one optical electronic device disposed under the first optical area,
- wherein the at least one optical electrode device includes a camera, a proximity sensor, an illuminance sensor or an infrared sensor.

21. The display device according to claim 19, wherein the plurality of wiring lines are gate lines or data lines.

22. The display device according to claim 19, wherein the first optical area includes:
- a plurality of circuit areas including light emitting elements and wiring lines; and
- a plurality of first transmission areas for passing light that are free of any light emitting elements, wiring lines and transistors,
- wherein the plurality of circuit areas and the plurality of first transmission areas are alternately and repeatedly arranged in the first optical area.

23. The display device according to claim 19, wherein each of the first light emitting element and the second light emitting element located in the first optical area is connected to at least one transistor disposed in the normal area.

24. The display device according to claim 19, wherein the first light emitting element and the second light emitting element are connected to a same driving transistor located in the normal area.

* * * * *